(12) United States Patent
Horsky et al.

(10) Patent No.: US 8,586,459 B2
(45) Date of Patent: Nov. 19, 2013

(54) ION IMPLANTATION WITH MOLECULAR IONS CONTAINING PHOSPHORUS AND ARSENIC

(75) Inventors: Thomas N. Horsky, Boxborough, MA (US); Erin Dyker, Halifax (CA); Brian Bernstein, Lexington, MA (US); Dennis Manning, Commerce, OK (US)

(73) Assignee: SemEquip, Inc., Billerica, MA (US)

( * ) Notice: Subject to any disclaimer, the term of this patent is extended or adjusted under 35 U.S.C. 154(b) by 0 days.

(21) Appl. No.: 11/934,873

(22) Filed: Nov. 5, 2007

(65) Prior Publication Data

US 2008/0122005 A1    May 29, 2008

Related U.S. Application Data

(60) Provisional application No. 60/856,994, filed on Nov. 6, 2006.

(51) Int. Cl.
*H01L 21/265* (2006.01)
*H01L 21/8238* (2006.01)
*H01L 27/092* (2006.01)

(52) U.S. Cl.
USPC .......................................... 438/513; 438/224

(58) Field of Classification Search
CPC .. H01L 27/092; H01L 21/265; H01L 21/8238
USPC .................. 438/513, 224; 257/369, E21.632, 257/E27.092, E21.334
See application file for complete search history.

(56) References Cited

U.S. PATENT DOCUMENTS

| | | | |
|---|---|---|---|
| 4,721,683 | A | 1/1988 | Ward |
| 2006/0097193 | A1 | 5/2006 | Horsky et al. |
| 2006/0097645 | A1* | 5/2006 | Horsky .................... 315/111.81 |

* cited by examiner

*Primary Examiner* — Walter H Swanson
(74) *Attorney, Agent, or Firm* — John S. Paniaguas; Katten Muchin Rosenman LLP

(57) ABSTRACT

An ion implantation device and a method of manufacturing a semiconductor device is described, wherein ionized phosphorus-containing molecular clusters are implanted to form N-type transistor structures. The clusters are implanted to provide N-type doping for Source and Drain structures and Pocket or Halo formation, and for counter-doping Poly gates. These doping steps are critical to the formation of NMOS transistors. The molecular cluster ions have the chemical form $AnHx^+$, or $AnRHx^+$, where n and x are integers with $4 \leq n$ and $x \geq 0$, and A is either As or P, and R is a molecule not containing phosphorus or arsenic, which is not injurious to the implantation process.

35 Claims, 18 Drawing Sheets

Overall system schematic showing gas and vapor delivery system and ion source.

Overall system schematic showing ion source mounted into ion implanter delivering beam to wafer.

CMOS Structure

- Source /Drain Extensions (DE)
- Deep Source/Drains (S/D)
- Poly Gate
- Halo

CMOS device structure showing P+ and N+ implants
which can be performed with molecular ions and clusters.

Ion source using an external electron beam for "soft" ionization of large molecules such as $B_{18}H_{22}$ and $P_7H_3$ Dual-Mode ion source which uses both soft ionization and arc discharge ionization methods.

Molecular structures of Heptaphosphane, $P_7H_3$

Molecular structure of Cyclopentaphosphane, $P_5H_5$

Molecular structure of a P7 ion from a monophosphide material source

Molecular structure of Tetra-tertbutylhexaphosphane

Molecular structure of Pentamethylheptaphosphane

As7H3 molecular structure

Mass Spectrum of $P_7H_3$

EXAMPLE OF CMOS FABRICATION SEQUENCE
NMOS DRAIN EXTENSION

ION IMPLANTATION WITH MOLECULAR IONS CONTAINING PHOSPHORUS AND ARSENIC

CROSS REFERENCE TO RELATED APPLICATIONS

This application claims priority to and the benefit of U.S. Provisional Application No. 60/856,994, filed on Nov. 6, 2006, hereby incorporated by reference.

BACKGROUND OF THE INVENTION

1. Field of the Invention

The present invention relates to a method of semiconductor manufacturing in which N-type doping is accomplished by the implantation of ion beams formed from ionized molecules, said ions being of the form $AnHx^+$, or $AnRHx^+$, where n and x are integers with n greater than 4 and x greater than or equal to 0, and A is either As or P, and R is a molecule not containing phosphorus or arsenic, which is not injurious to the implantation process.

2. Description of the Prior Art

The Ion Implantation Process

The fabrication of semiconductor devices involves, in part, the introduction of specified impurities into the semiconductor substrate to form doped regions. The impurity elements are selected to bond appropriately with the semiconductor material so as to create electrical carriers. This introduction alters the electrical conductivity of the semiconductor material in the "doped" region. The concentration of dopant impurities so introduced determines the electrical conductivity of the resultant region. The electrical carriers can either be electrons (generated by N-type dopants) or holes (generated by P-type dopants). Many such N- and P-type impurity regions must be created to form transistor structures, isolation structures and other such electronic structures, which function collectively as a semiconductor device.

Ion implantation is the conventional method of introducing dopants into a semiconductor substrate. In ion implantation, a feed material containing the desired element is introduced into an ion source and energy is supplied to ionize the feed material, creating ions which contain the dopant element. For example, in silicon the elements As, P, and Sb are donors or N-type dopants, while B and In are acceptors or P-type dopants. An accelerating electric field is provided to extract and accelerate the ions, thus creating an ion beam. Typically, the ions contain a positive charge. However, in certain cases negatively-charged ions may be used. Mass analysis is used to select the exact species to be implanted. The mass-analyzed in beam may subsequently pass through ion optics which alter its final velocity or change its spatial distribution prior to being directed into a semiconductor substrate or work piece. The accelerated ions possess a well-defined kinetic energy which allows the ions to penetrate the target to a predetermined depth. Both the energy and mass of the ions determine their depth of penetration into the target. Higher energy and/or lower mass ions allow deeper penetration into the target due to their greater velocity. The ion implantation system is constructed to carefully control the critical variables in the implantation process. Critical variables include: the ion acceleration, ion mass, ion beam current (electrical charge per unit time), and ion dose at the target (total number of ions per unit area that penetrate into the target). Beam angular divergence (the variation in the angles at which the ions strike the substrate) and beam spatial uniformity and extent must also be controlled in order to preserve semiconductor device yields.

A key process of semiconductor manufacturing is the creation of P-N junctions within the semiconductor substrate. This requires the formation of adjacent regions of P-type and N-type doping. An important example of the formation of such a junction is the implantation of P or N-type dopants into a semiconductor region already containing a uniform distribution of one dopant type. In these cases, an important parameter is the junction depth. The junction depth is defined as: the depth from the semiconductor surface at which the P-type and N-type dopants have equal concentrations. This junction depth is a function of the implanted dopant mass, energy and dose.

An important aspect of modern semiconductor technology is the continuous evolution to smaller and faster devices. This process is called scaling. Scaling is driven by continuous advances in lithographic process methods, allowing the definition of smaller and smaller features in the semiconductor substrate which contains the integrated circuits. A generally accepted scaling theory has been developed to guide chip manufacturers in simultaneously resizing all design aspects of the semiconductor device: i.e., at each technology or scaling node. The greatest scaling impact on ion implantation processes is the scaling of junction depths. This requires decreasing the junction depth as the device dimensions are decreased, requiring shallower junctions as integrated circuit technology scales. This translates into the following requirement: ion implantation energies must be reduced with each scaling step. The extremely shallow junctions called for by modern, sub-100 nanometer (nm) devices are termed "Ultra-Shallow Junctions", or USJ.

Physical Limitations on Low-Energy Beam Transport

Due to the aggressive scaling of junction depths in CMOS processing, the ion energy required for many critical implants has decreased to the point that conventional ion implantation systems cannot maintain the desired wafer throughput. The limitations of conventional ion implantation systems at low beam energy are most evident in the extraction of ions from the ion source, and their subsequent transport through the implanter's beam line. Ion extraction is governed by the Child-Longmuir relation, which states that the extracted beam current density is proportional to the extraction voltage (i.e., beam energy at extraction) raised to the 3/2 power. Similar constraints affect the transport of the low-energy beam after extraction. A lower energy ion beam travels with a smaller velocity, hence for a given value of beam current the ions are closer together, i.e., the ion density increases. This can be seen from the relation $J=\eta ev$, where J is the ion beam current density in mA/cm$^2$, $\eta$ is the ion density in ions/cm$^{-3}$, e is the electronic charge (=$6.02 \times 10^{-19}$ Coulombs), and v is the average ion velocity in cm/s. In addition, since the electrostatic forces between ions are inversely proportional to the square of the distance between them, electrostatic repulsion is much stronger at low energy, resulting in increased dispersion of the ion beam. This phenomenon is called "beam blow-up" and is the principal cause of beam loss in low-energy transport. Low-energy electrons present in the implanter beam line tend to be trapped by the positively-charged ion beam, compensating for space-charge blow-up during transport. Blow-up nevertheless still occurs, and is most pronounced in the presence of electrostatic focusing lenses, which tend to strip the loosely-bound, highly mobile compensating electrons from the beam. In particular, severe extraction and transport difficulties exist for light ions, such as the N-type dopants phosphorus and arsenic. Being lighter than arsenic, the phosphorus atoms penetrate further into the substrate than many other atoms, including arsenic. Hence the required implantation energies for phosphorus are lower than for arsenic. In fact, extremely low implantation energies, as low as 1 keV, are being required for certain leading edge USJ processes.

Heavier species, specifically cluster molecules, not only provide increased beam currents, but in many cases tend to amorphize the crystalline silicon lattice. This type of amorphization has been shown to be beneficial to the activation of P-type dopants such as boron, and should provide similar benefits for N-type dopants. Also, amorphization reduces ion channeling, enabling a shallower junction than possible in crystalline silicon. In fact, the process of record for many USJ logic manufacturers consists of a pre-amorphization implant of Ge or Si prior to performing the conductive doping implants in order to obviate channeling effects. The use of Ge or Si pre-amorphization implants has been shown to create end-of-range defects which result in increased leakage currents in the fabricated devices.

Molecular Ion Implantation

A technique to overcome the limitations imposed by the Child-Langmuir relation discussed above is to increase the transport energy is by ionizing a molecule containing the dopant of interest, rather than a single dopant atom. Upon entering the substrate, the molecule breaks up into its constituent atoms, sharing the energy of the molecule among the individual atoms according to their distribution in mass. While the kinetic energy of the molecule is higher during transport, the dopant atom's implantation energy is much lower than the original transport kinetic energy of the molecular ion. Consider the dopant atom "X" bound to a radical "Y" (disregarding for purposes of discussion the issue of whether "Y" affects the device-forming process). If the ion $XY^+$ were implanted in lieu of $X^+$, then $XY^+$ must be extracted and transported at a higher energy. The increase is by a factor equal to the mass of XY divided by the mass of X. This ensures that the velocity of X in either case is the same. Since the space-charge effects described by the Child-Langmuir relation discussed above are super-linear with respect to ion energy, the maximum transportable ion current is increased. Historically, the use of polyatomic molecules to ameliorate the problems of low energy implantation is well known in the art. A common example has been the use of the $BF_2^+$ molecular ion for the implantation of low-energy boron, in lieu of $B^+$. This process dissociates $BF_3$ feed gas to the $BF_2^+$ ion for implantation. In this way, the ion mass is increased to 49 AMU from 11 AMU. This increases the extraction and transport energy by more than a factor of 4 (i.e., 49/11) over using single boron atoms. Upon implantation, however, the boron energy is reduced by the same factor of (49/11). It is worthy of note that this approach does not reduce the current density in the beam, since there is only one boron atom per unit charge in the beam. A detriment to this process is the implanting of fluorine atoms into the semiconductor substrate along with the boron. This is an undesirable feature of this technique since fluorine has been known to exhibit adverse effects on the semiconductor device.

Cluster Implantation

A more effective way to increase the dose rate is to implant clusters of dopant atoms. That is, molecular ions of the form $X_nY_m^+$, where n and m are integers and n is greater than one. Recently, there has been seminal work using octadecaborane as a feed material for ion implantation. The implanted particle was a positive ion of the octadecaborane molecule, $B_{18}H_{22}$, which contains 18 boron atoms, and is therefore a "cluster" of 18 boron atoms. This technique not only increases the mass of the ion and hence the transport ion energy, but for a given ion current, it substantially increases the implanted dose rate, since the octadecaborane ion $B_{18}H_x^+$ has eighteen boron atoms. By significantly reducing the electrical current carried in the ion beam (by a factor of 18 in the case of octadecaborane ions verses single boron atoms) not only are beam space-charge effects reduced, increasing beam transmission, but wafer charging effects are reduced as well. Since positive ion bombardment is known to reduce device yields by charging the wafer, particularly damaging sensitive gate isolation, such a reduction in electrical current through the use of cluster ion beams is very attractive for USJ device manufacturing. USJ manufacturing must accommodate increasingly thinner gate oxides and exceedingly low gate threshold voltages. Thus, there is a critical need to solve two distinct problems facing the semiconductor manufacturing industry today: wafer charging, and low productivity in low-energy ion implantation. A favorable attribute is the self-amorphizing feature in the implant as described earlier. As discussed below, the present invention increases the benefits of N-type cluster implantation by using significantly larger phosphorus or arsenic clusters having more than 3 dopant atoms.

SUMMARY OF THE INVENTION

Compounds of the Form $A_nH_x$ and $A_nRH_x$

The invention described herein consists of a method of implanting semiconductor wafers with ions of N-type clusters of phosphorus (P) or arsenic (As), where the molecular cluster ions have the chemical form $AnHx^+$, or $AnRHx^+$, where A designates either arsenic or phosphorus, n and x are integers with n greater than or equal to 4, and x greater than or equal to 0, and R is a molecule not containing phosphorus or arsenic and which is not injurious to the implantation process. These ions are produced from chemical compounds of the form AnHx and AnRHx.

Means are also described to vaporize solid material and transport the vapors of chemical compounds to an ion source to produce said ions, and means to extract said ions from the ion source, thus forming an ion beam which can be transported to a semiconductor wafer containing semiconductor devices to be implanted. And exemplary vapor transport and ion source arrangement is shown in FIG. 1. Two ion sources ideally suited for producing molecular and cluster ions are shown in FIG. 3 and FIG. 4. An exemplary ion implantation system is shown in FIG. 1(b).

An object of this invention is to provide a method of manufacturing a semiconductor device, this method being capable of forming ultra-shallow impurity-doped regions of N-type (i.e., acceptor) conductivity in a semiconductor substrate, and furthermore to do so with high productivity.

Another object of this invention is to provide a method of manufacturing a semiconductor device, this method being capable of forming ultra-shallow impurity-doped regions of N-type (i.e., acceptor) conductivity in a semiconductor substrate using ionized clusters of the form $AnHx^+$, or $AnRHx^+$, where n and x are integers with $4 \leq n$, and $x \geq 0$, R is a molecule not containing phosphorus and which is not injurious to the implantation process, and A designates either arsenic or phosphorus.

A further object of this invention is to provide a method of manufacturing a semiconductor device by implanting ionized molecules of Heptaphosphane, $P_7H_3$, or of the form $P_7H_x^+$ or $P_7H_x^-$, where x is an integer less than or equal to 3.

A further object of this invention is to provide a method of manufacturing a semiconductor device by implanting ionized molecules of $As_7H_3$, or of the form $As_7H_x^+$ or $As_7H_x^-$, where x is an integer less than or equal to 3.

A still further object of this invention is to provide for an ion implantation system for manufacturing semiconductor devices, which has been designed to form ultra shallow impurity-doped regions of either N or P conductivity type in a semiconductor substrate through the use of cluster ions.

According to one aspect of this invention, there is provided a method of implanting cluster ions comprising the steps of: providing a supply of molecules which each contain a plurality of dopant atoms into an ionization chamber, ionizing said molecules into dopant cluster ions, extracting and accelerating the dopant cluster ions with an electric field, selecting the desired cluster ions by mass analysis, modifying the final implant energy of the cluster ion through post-analysis ion optics, and implanting the dopant cluster ions into a semiconductor substrate.

An object of this invention is to provide a method that allows the semiconductor device manufacturer to ameliorate the difficulties in extracting low energy ion beams by implanting a cluster of n dopant atoms (n=7 in the case of $P_7H_x^+$ or $As_7H_x^+$) rather than implanting a single atom at a time. The cluster ion implant approach provides the equivalent of a much lower energy monatomic implant since each atom of the cluster is implanted with an energy of approximately E/n. Thus, the implanter is operated at an extraction voltage approximately n times higher than the required implant energy, which enables higher ion beam current, particularly at the low implantation energies required by USJ formation. In addition, each milliamp of cluster current provides the equivalent of 7 mA of monomer phosphorus or arsenic. Considering the ion extraction stage, the relative improvement in transport efficiency enabled by cluster ion implant can be quantified by evaluating the Child-Langmuir limit. It is recognized that this limit can be approximated by:

$$J_{max} = 1.72 (Q/A)^{1/2} V^{3/2} d^{-2}, \quad (1)$$

Where $J^{max}$ is in $mA/cm^2$, Q is the ion charge state, A is the ion mass in AMU, V is the extraction voltage in kV, and d is the gap width in cm. In practice, the extraction optics used by many ion implanters can be made to approach this limit. By extension of equation (1), the following figure of merit, $a$, can be defined to quantify the increase in throughput, or implanted dose rate, for a cluster ion implant relative to monatomic implantation:

$$a = n(U_n/U_1)^{3/2} (m_n/m_1)^{-1/2}. \quad (2)$$

Here, $a$ is the relative improvement in dose rate (atoms/sec) achieved by implanting a cluster with n atoms of the dopant of interest at an energy $U_n$ relative to the single atom implant of an atom of mass $m_1$ at energy $U_1$, where $U_i$=eV. In the case where $U_n$ is adjusted to give the same dopant implantation depth as the monatomic (n=1) case, equation (2) reduces to:

$$a = n^2. \quad (3)$$

Thus, the implantation of a cluster of n dopant atoms has the potential to provide a dose rate $n^2$ higher than the conventional implant of single atoms. In the case of $P_7H_x$, this maximum dose rate improvement is about 50×. The use of cluster ions for ion implant clearly addresses the transport of low-energy (particularly sub-keV) ion beams. It is to be noted that the cluster ion implant process only requires one electrical charge per cluster, rather than having every dopant atom carrying one electrical charge, as in the conventional case. The transport efficiency (beam transmission) is thus improved, since the dispersive Coulomb forces are reduced with a reduction in charge density. Importantly, this feature enables reduced wafer charging, since for a given dose rate, the electrical beam current incident on the wafer is dramatically reduced. Also, since the present invention is expected to produces copious amounts of negative ions, in the same way that copious amounts of negative ions are produced from the boron hydrides, such as $B_{18}H_x^-$, it enables the commercialization of negative ion implantation at high dose rates. Since negative ion implantation produces less wafer charging than positive ion implantation, and since these electrical currents are also much reduced through the use of clusters, yield loss due to wafer charging can be further reduced. Thus, implanting with clusters of n dopant atoms rather than with single atoms ameliorates basic transport problems in low energy ion implantation and enables a dramatically more productive process.

Enablement of this method requires the formation of the cluster ions. The prior art ion sources used in commercial ion implanters produce only a small fraction of primarily lower-order (e.g., n=2) clusters relative to their production of monomers, and hence these implanters cannot effectively realize the low-energy cluster beam implantation advantages listed above. Indeed, the intense plasmas provided by many conventional ion sources rather dissociate molecules and clusters into their component elements. The novel ion source described herein produces cluster ions in abundance due to its use of a "soft" ionization process, namely electron-impact ionization. The ion source described herein is designed expressly for the purpose of producing and preserving dopant cluster ions. Instead of striking an arc-discharge plasma to create ions, the ion source uses electron-impact ionization of the process gas by electrons injected in the form of a focused electron beam.

DESCRIPTION OF THE DRAWINGS

These and other advantages of the present invention will be readily understood with reference to the following specification and attached drawing wherein.

CHEMICAL PROPERTIES OF PHOSPHORUS-BEARING COMPOUNDS

Figure 8:
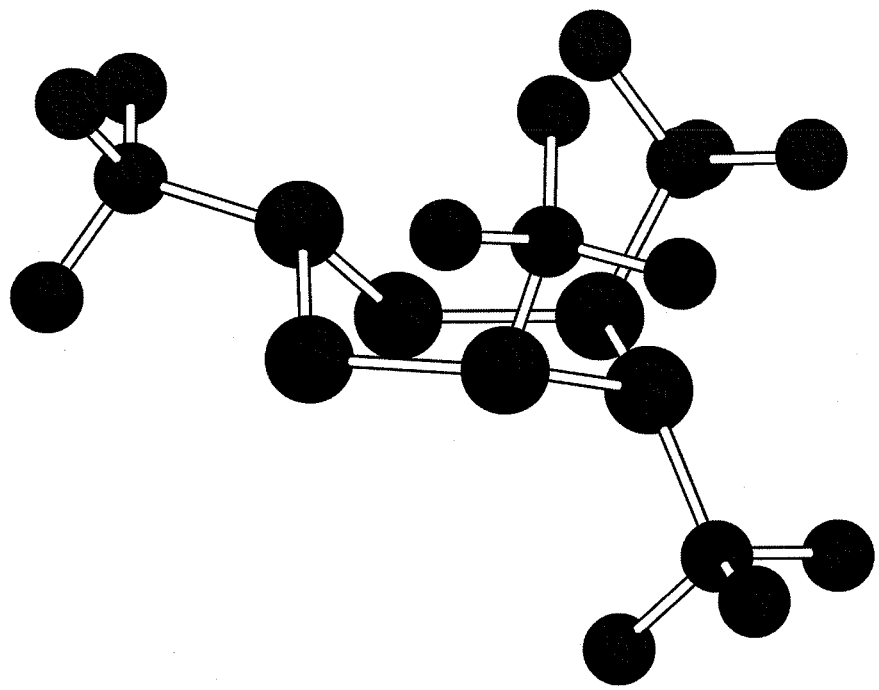
FIG. 8 shows the molecular structure of Tetra-tertbutylhexaphosphane.
Figure 9:
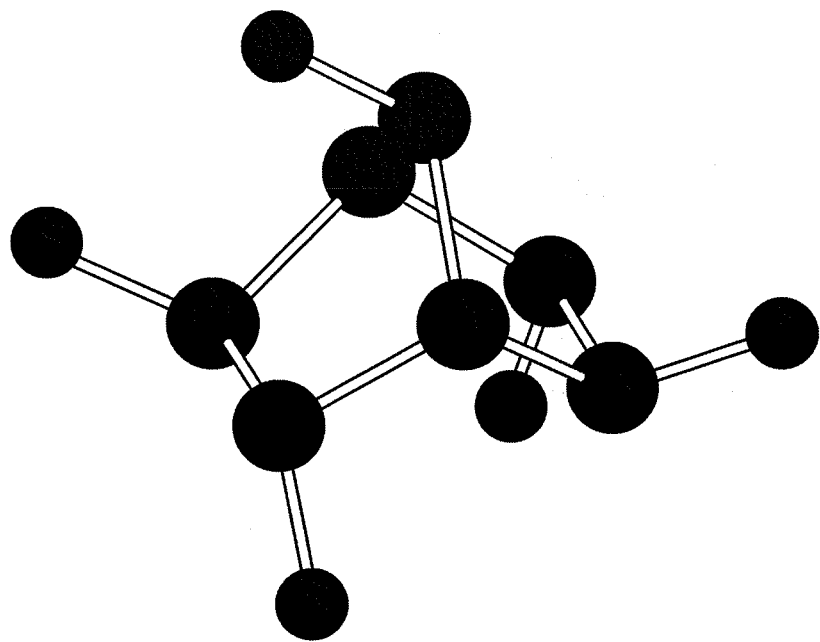
FIG. 9 shows the molecular structure of Pentamethylheptaphosphane.

Properties of candidate compounds phosphanes, organophosphanes and phosphides potentially provide a source for cluster phosphorus molecules and the subsequent ions. The following definitions clarify the chemical differences: (1) phosphane: (aka. phosphorus hydride) a compound comprised of phosphorus and hydrogen atoms where the phosphorus atoms are bonded together in a linear, ring or cluster arrangement. (i.e.; Heptaphosphane, $P_7H_3$ (see FIG. 5) Cyclopentaphosphane, $P_5H_5$ (see FIG. 6), (2) Organophosphane: a compound comprised of phosphorus and hydrogen atoms where the phosphorus atoms are bonded together in a linear, ring or cluster arrangement where some or all hydrogen atoms are replaced with organic substituents (i.e.; Tetra-tertbutylhexaphosphane, $tBu_4P_6$ (see FIG. 8), Pentamethylheptaphosphane, $Me_5P_7$ (see FIG. 9), (3) Phosphides: a compound comprised of phosphorus and metal atoms where the phosphorus atoms are bonded together in a linear, ring or cluster arrangement. (i.e.; Polyphosphides: $Ba_3P_{14}$, $Sr_3P_{14}$ or Monophosphides: $Li_3P_7$, $Na_3P_7$, $K_3P_7$, $Rb_3P_7$, $Cs_3P_7$).

Cyclic phosphanes provide the most encouraging source of dopant clusters favorable to ionization and subsequent implantation. Criterion used to evaluate the compound application feasibility included: a) material stability at room temperature, b) decomposition sensitivity in the presence of moisture and/or oxygen, c) synthesis route history and d) ionization potential. Heptaphosphane $P_7H_3$, depicted in FIG. 5, has the greatest potential of providing a simple cluster source for implantation. Mass spectroscopy data for Heptaphosphane indicates the material is favorable for developing ion clusters under the appropriate conditions. Heptaphosphane also conforms to the desired property stability criterion as detailed above.

Chemical Properties of $P_7H_3$

Figure 4:
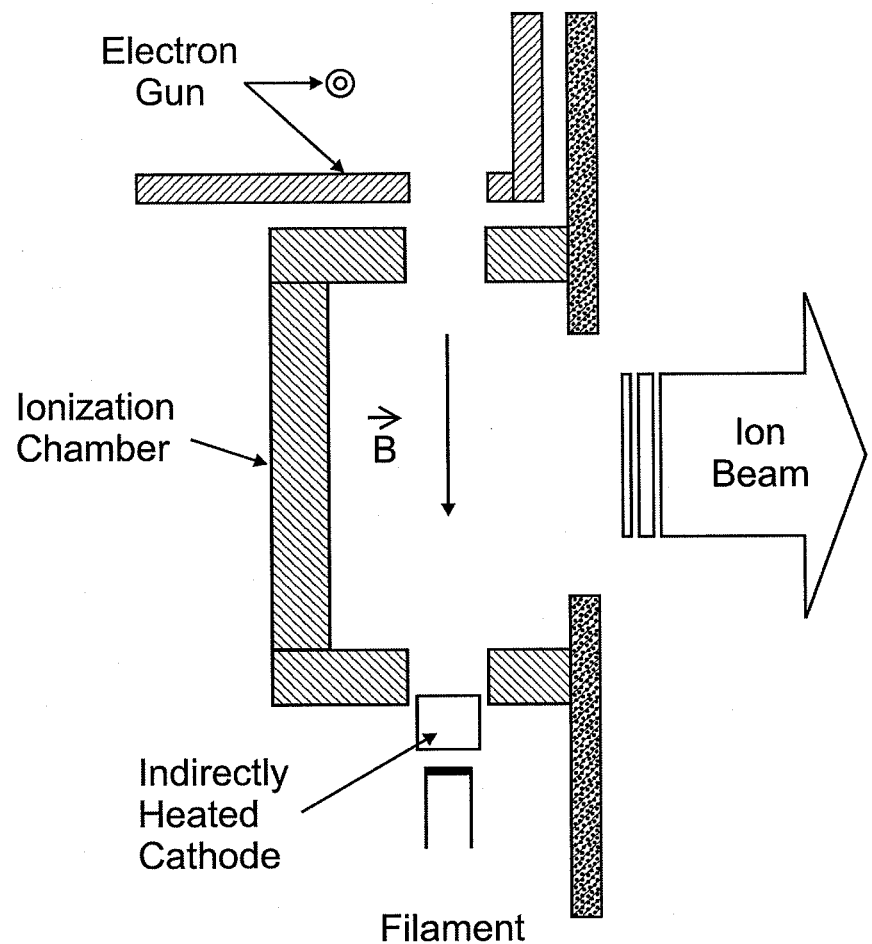
FIG. 4 is a schematic diagram of an exemplary dual-mode ion source having both a soft ionization mode and an arc discharge mode for use with the present invention.

Molecular weight: 220 g/mol, See FIG. 4 for structure.

Thermal Stability: Stable up to 300° C. at which temperature it decomposes.

Reactivity at Room Temperature: Oxidizers slowly to $P_7H_3O$; reacts with water to give phosphoric acids; stable under inert atmosphere.

State at Room Temperature: Solid.

Methods of Producing $P_7H_3$ and Other Related Compounds

Multiple synthesis routes have proved feasible for producing $P_7H_3$. While numerous methods have been publicized, the most feasible routes have been identified. Four feasible pathways have been identified for manufacturing Heptaphosphane. Various reaction schemes can be combined to utilize available starting materials. Using CaP as the initial material, $P_2H_4$ can be isolated (Baudler, M., Glinka, K. Chem. Rev. 94 (1994) 1273) and further processed into $P_7H_4$. (Baudler, M., Temberger, H., Faber, W., Hahn, J. Z. Naturforsch. 34B (1979) 1690). Starting from white phosphorus, $(Me_3Si)_3P_7$ can be isolated (Fritz, G., Hölderich, W. Naturwissenschaften 62 (1975) 573.) and subsequently converted to $P_7H_3$ (Baudler, M., Temberger, H., Faber, W., Hahn, J. Z. Naturforsch. 34B (1979) 1690). White phosphorus and phosphine can also be utilized (Schäfer. Z. Anorg. Allg. Chem. 428 (1977) 222) to allow isolation of $LiPH_2$*monoglyme and subsequently converted to $PH_3$ (Baudler, M., Faber, W. Chem. Ber. 113 (1980) 3394) then $P_7H_3$ per Baudler et al.

Figure 6:
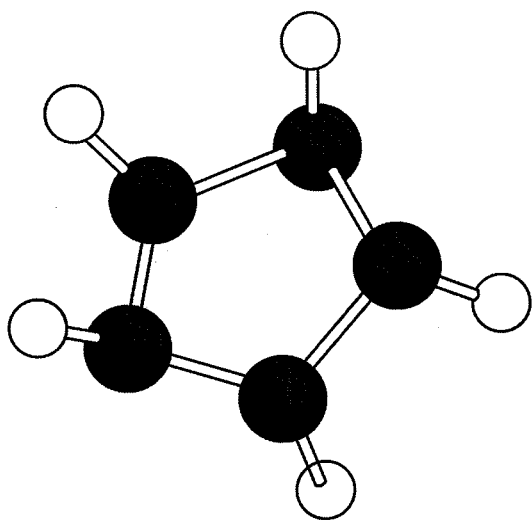
FIG. 6 shows the molecular structure of Cyclopentaphosphane, $P_5H_5$.

Cyclopentaphosphane-(5), FIG. 6, has also been synthesized by combining various reaction sequences. $(Me_3Si)_3P$ can be converted to $Me_3SiPH_2$ (Bürger, H., Goetze, U. J. Organomet. Chem. 12 (1968) 451) then to $(Me_3SiP)_4$ (Baudler, M., Hofmann, G., Hallab, M. Z. Anorg. Allg. Chem. 466 (1980) 71.) and finally $P_5H_5$ (Baudler, M. Angew. Chem. Int. Ed., Engl. 21 (1982) 492). An alternative route utilizes CaP to $P_2H_4$ (Baudler, M., Glinka, K. Chem. Rev. 94 (1994) 1273) then and subsequently $P_5H_5$ (Baudler, M. Angew. Chem. Int. Ed., Engl. 21 (1982) 492).

Figure 7:
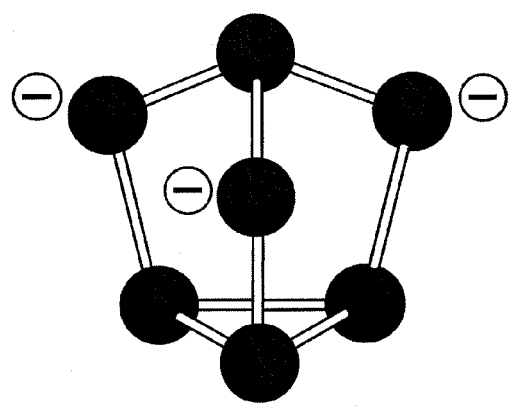
FIG. 7 shows the molecular structure of a $P_7$ ion from a monophosphide material source.

All monophosphide synthesis routes utilize the same technique: direct reaction of gaseous phosphorus with the metal of choice. The predicted phosphorus cluster ion is depicted in FIG. 7. Various references support these synthesis pathways. (Von Schnering, H., Homoatomic Rings, Chains, and Macromolecules of the Main Group Elements, Elsevier, Ampsterdam, 1977, 317 (ed. A. Rheingold) (Von Schnering, H. G., Hönle, W. Chem. Rev. 88 (1988) 243), (Manriquez, V., Hönle, W., Von Schnering, H. G. Z. Anorg. Aug. iChem. 539 (1986) 95), (Abicht, H., Hönle, W., Von Schnering, H. G. Z. Anorg. Allg. Chem. 519 (1984) 7), (Meyer, T., Hönle, W., Von Schnering, H. G. Z. Anorg. Allg. Chem. 552 (1987) 69), and (Santandrea, R., Mensing, C., Von Schnering, H. G. Thermochimica Acta. 98 (1986) 301).

Organophosphorous materials have also been successfully prepared. Tetra-tertbutylhexaphosphane, FIG. 8, (Charles, S., Eichhorn, B., Rheingold, A., Bott, S. J. Am. Chem. Soc. 116 (1994) 8077.) and Pentamethylheptaphosphane FIG. 9, (Baudler, M., Aktalay, Y., Hahn, J., Därr, Z. Anorg. Allg. Chem. 473 (1981) 20) and (Baudler, M., Glinka, K. Inorg. Synth. 25 (1989) 1) are potential P cluster sources.

These synthesis routes establish a confirmed material manufacturing pathway and will support the estimated production capacity requirements at scaled operations.

Method of Producing $P_7H_3^+$ and $P_7H_3^-$ Ions

Characteristics in the analytical technique of mass spectroscopy are very similar to those used in ion implantation. In either technique a material is ionized with a "soft" ionization technique which in most cases largely preserves the parent molecule, however generally creating a number of ions of lower intensity and differing masses. The ions are then accelerated in an electric field and spatially separated by an electromagnetic or electrodynamic field into their constituent masses, as is known in the art. In ion implantation, an ion of one specific mass or a narrow range of masses is used for doping a substrate. Hence, species that ionize into an intense, single mass concentration in mass spectroscopy are typically excellent candidates for ion implantation. High concentrations of the desired implant species observed in mass spectroscopy give credence to successful ionization and implantation of the element into the targeted substrate. Baudler, M., Riekehof-Böhmer, R. Z. Naturforsch. 40B (1985) 1424 identified the pronounced $P_7H_3$ peak and disclosed the findings as:

"The mass spectrum (12 eV, 110 C, positive ion mode) of $P_7H_3$ displays an intensive peak at m/z=220, corresponding to the molecular ion. Signals corresponding to $P_7H_5$ and anions containing two to six phosphorus atoms are also present. These fragments are likely to be generated through thermolysis, fragmentation and hydrogen insertion. At a higher probe temperature (150-200 C) signals corresponding to $P_8$ and $P_9$ fragments are also present and the residue is deep red. Obviously, although $P_7H_3$ is more stable than $P_2H_4$, at higher temperatures it suffers the disproportionation that is typical for phosphanes."

Baudler further stated "Up to the present, the only such compound [phosphorus hydride] to be isolated in the pure state is $P_7H_3$, which is obtainable by the mild methanolysis of $P_7(SiMe_3)_3$. The other polycyclic phosphorus hydrides were obtained and investigated as enriched (in some cases highly enriched) mixtures. Because of their similar properties and pronounced tendencies to undergo dissproportionation, the separations of these compounds are extremely difficult. And, since the polycyclopolyphosphanes are mostly insoluble and amorphous, most of them are not amenable to direct characterization."

Substitution of As for P in $P_nH_x$ and $P_nRH_x$ Compounds

Material examples are focused toward phosphorus-containing species and supporting synthesis methods included in this text. However, these species have been theorized to allow direct substitution of the phosphorus atoms with arsenic to form similar arsenic species. The similarity in the outer shell electron configuration, isoelectronic similarity, gives rise to the direct replacement approach. Elemental atoms possess defined electron configurations per group and since covalent bonding is a result of the interaction of the electron orbitals, same group elements exhibit similar chemistry reactivity.

Figure 5:
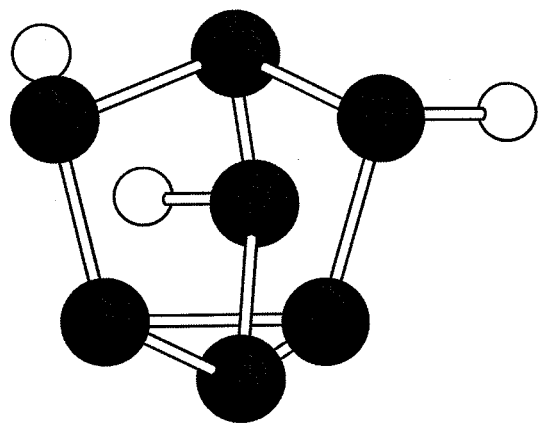
FIG. 5 shows the molecular structure of Heptaphosphane, $P_7H_3$.
Figure 10:
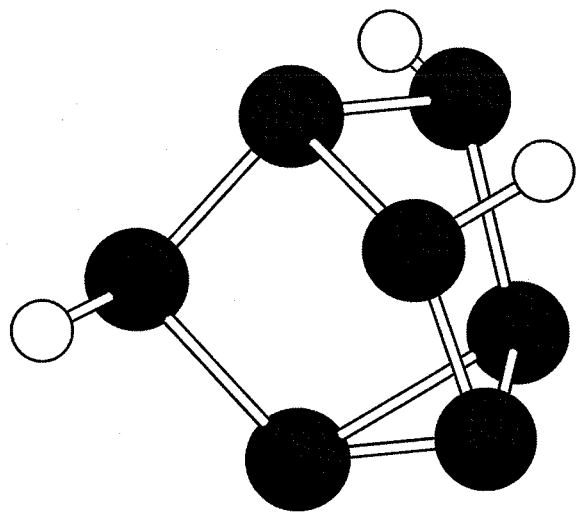
FIG. 10: Predicted $As_7H_3$ molecular structure.

Molecular prediction software indicates the similarity is substituting arsenic for phosphorus. As depicted in FIG. 10, the predicted molecular structure for $As_7H_3$ is nearly identical to $P_7H_3$ (as depicted in FIG. 5) with differences being limited to the individual atomic radii of phosphorus and arsenic. Similar ion species formation was observed by Schmettow and Schnering (W. Schmettow and H. G. von Schnering; "$Ba_3As_{14}$, the first compound with the cluster $As_7^{-3}$", Anqew. Chem, Int Edn (Engl) 16, 857 (1977) when As was heated with Ba. Schnering later isolated the analogous methylated silicon compounds $P_{11}(SiMe_3)_3$ and $As_7(SiMe_3)_3$. (H. G. von Schnering, D. Fenske, W. Honle and K. Peters: "Novel polycyclic phosphanes and arsanes: $P_{11}(SiMe_3)_3$ and $As_3(SiMe_3)_3$", Angew. Chem. Int. Edn. (Engl) 18, 679 (1979)). The present $P_7H_3$ synthesis pathway utilized to develop the accompanying mass spectrum requires formation of $P_7(SiMe_3)_3$ then isolation of $P_7H_3$ by alcohol addition. Greenwood and Earnshaw (N. N. Greenwood, A. Earnshaw, *Chemistry of the Elements*, Butterworth and Heinemann Ltd, 1984, pgs 637-697) continually compared the isoelectronic and isostructural similarities between arsenic and phosphorus. Therefore, it can be construed synthesis pathways for $P_7H_3$ and $As_7H_3$ are analogous and interchangeable. In addition, since both Si and H are not injurious to devices formed on silicon wafers, the compounds $As_7(SiH_3)_3$ and $As_5(SiH_3)_5$ would be very attractive, and are predicted to be stable compounds.

Materials in the form of $A_nRH_x$ may be formulated in a manner to allow selective removal of the phosphorus or arsenic containing portion independently of the remaining molecular structure, R. This characteristic may be highly desirable to increase the level of safe transportation in that the complex is less volatile, hence less susceptible to emissions than the pure component. The residual material may be left in the transport container and "recharged" in normal cycle operations. Furthermore, the R molecular portion may be removed prior to the targeted dopant containing species, discarded or recycled to provide an increased margin of safety during transportation. Synthesis pathways to develop numerous organometallic compounds are well documented and known within the art. Coates, Green, Powell and Wade (G. E. Coates, M. L. H. Green, P. Powell and K. Wade, Group VB elements, in Principles of Organometallic Chemistry, pp. 143-149, Methun, London, 1968) detail pathways to multiple organometallic arsenic compounds.

Other As and P-Bearing Compounds of Interest

"In addition to the 6-membered ring in $(P/As)_6$, 5-membered rings have been obtained with R=Me, Et, Pr, Ph, $CF_3$, $SiH_3$, $GeH_3$ and 4-membered rings occur with $R=CF_3$, Ph." (N. N. Greenwood, A. Earnshaw, *Chemistry of the Elements*, Butterworth and Heinemann Ltd, 1984, pgs 637-697) Thus, carbonyl groups are directly interchangeable with silicon hydrides, as well known in the art. Earlier investigation into these ring compounds was completed by Donohue (Donohue, J., University of Southern California, Los Angeles, Acta Cryst (1962), 15, 708-713.) He also concluded the similarities of the phosphorus and arsenic rings. Gupta, Krannich and Watkins substantiated the formation of stable, large molecular 5 and 6 atom arsenic rings in the form $(RAs)_n$ where R represented the appropriate carbonyl group. (Synthesis of cyclic polyarsines: Gupta, Krannich L., Watkins, C., Inorganic Chemistry (1987) 26(10) 1338-1640.) Later, the ring clusters were expanded to 8 arsenic atoms. ($tBu_6As_8$, $tBu_6As_8$: A compound of known composition and new structure, Von Hanish, C., Fenske, D. Zeitschrift Anorganische and Allgemeine Chemie (1997), 623(7), 1040-1042.) It has also been shown metal centers can support 6 organoarsenic rings (Synthesis and characterization of $[Ni(tBuAs)_6]$ and $[Pd(tBuAs)_6]$. (Hey-Hawkins, E., Pink, M. and Oesen, H., Zeitschrift Anorganische and Allgemeine Chemie (1996), 622(4), 689-691). The metal centering species may provide the foundation for stabilized delivery systems as aforementioned. As indicated by previous art, multiple arsenic and phosphorus compounds have been successfully prepared and isolated.

In addition, a silicon phosphide has also been identified: $Si_{12}P_5$. The article is listed in: Journal of Vacuum Science & Technology A: Vacuum, Surfaces, and Films, Volume 15, Issue 2, March 1997, pp. 394-401. This material would be extremely useful in ultra-shallow junction formation of Halos and S/D Extensions, and also for Poly Gate doping. The mass of $Si_{12}P_5$ is about 491 amu. Thus, extremely shallow implants can be performed with this compound. In addition, since Si is routinely used for pre-amorphization prior to conducting the N-type drain extension implant, the $Si_{12}P_5$ implant would be self-amorphizing. It is likely there would not be deleterious end-of-range defects created by this implant, since the silicon would have about the same range as the P atoms, keeping damage very shallow. Such defects can be annealed out very effectively, since they tend to diffuse to the surface, when they annihilate.

Experimental Synthesis and RGA Results

Figure 11:
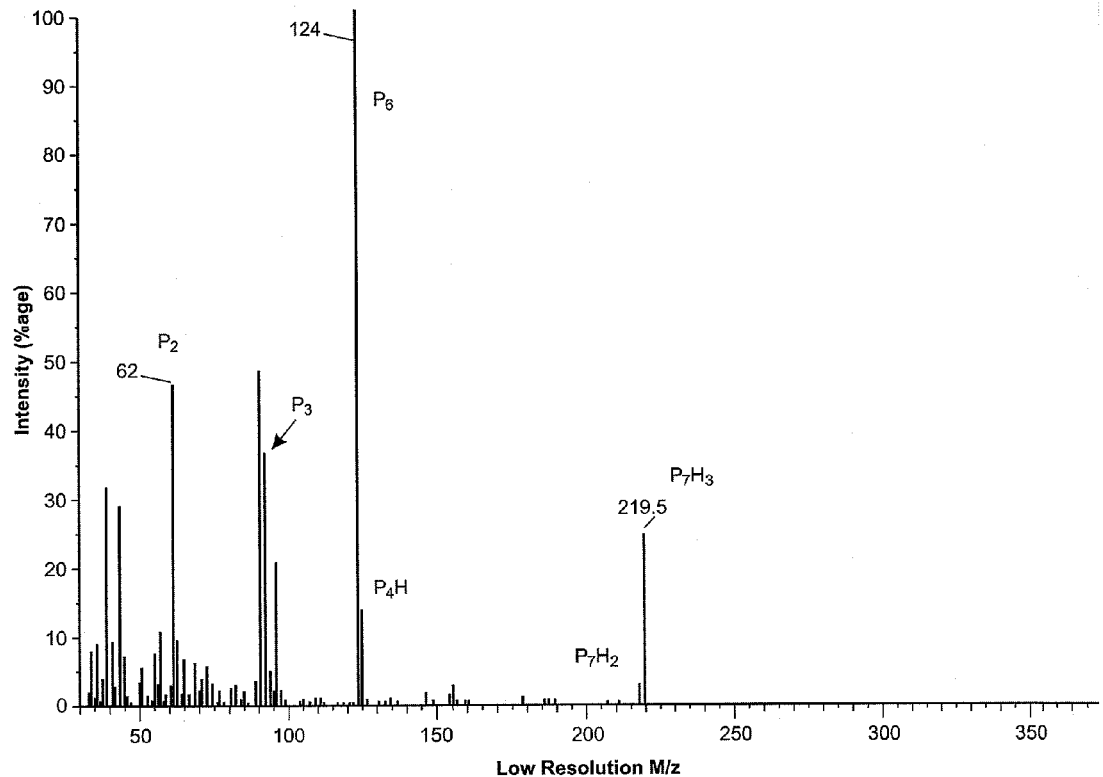
FIG. 11: Mass spectrum of $P_7H_3$.

A spectrum for $P_7H_3$ from a mass spectrometer is illustrated in FIG. 11. The most intense peak is for $P_4^+$, while the parent $P_7H_3^+$ peak is about 4 times smaller than the $P_4^+$ peak. The electron energy used was about 70 eV. As discussed in more detail below, more of the parent peak is preserved using a soft-ionization source.

Soft-Ionization Source System and Ion Implantation System

Figure 1:
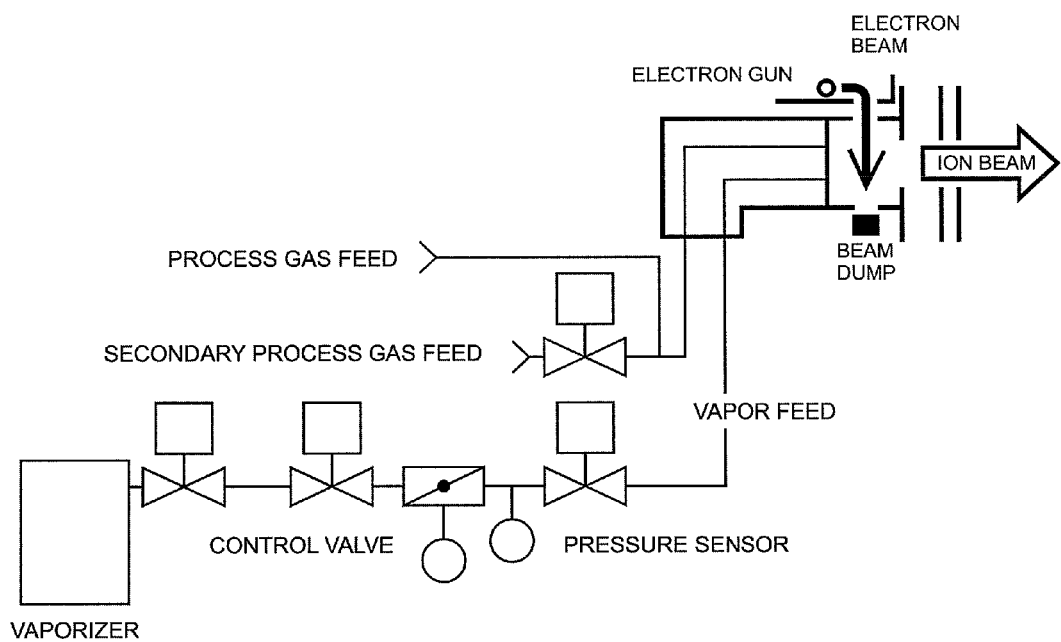
FIG. 1 is a schematic of an exemplary vapor delivery system and ion source for use with the present invention.
Figure 1A:
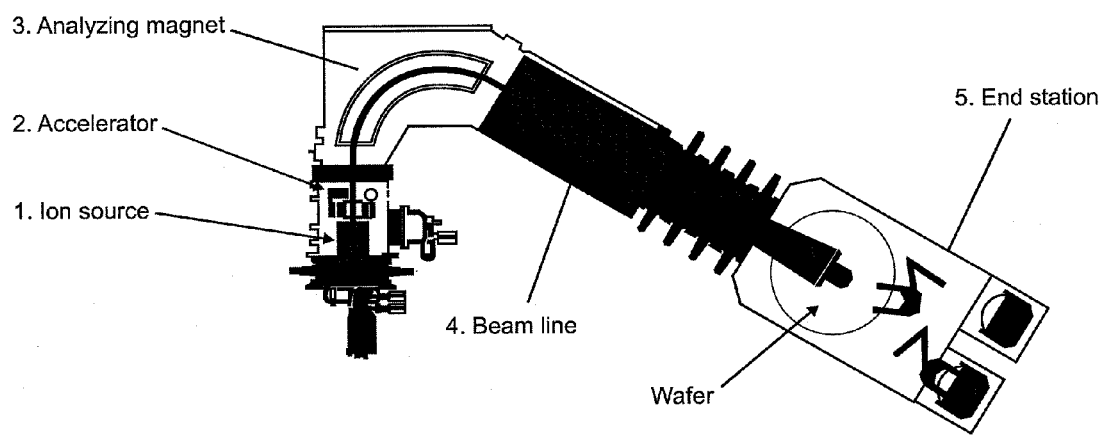
FIG. 1a is a schematic diagram of an exemplary ion implantation system for use with the present invention.

An Implanter source must have a carefully regulated supply of feed gas in order to provide a stable ion beam. Conventional ion sources use mass flow controllers (MFC's) for this function. However, MFC's are not able to regulate vapor flow rates for low-temperature solids such as octadecaborane, decaborane and heptaphosphane due to their requirement for a relatively high inlet pressure and pressure drop across the MFC. FIG. 1 shows an example of a valve network that provided regulated molecular flow of gas vapor to an ion source.

As described in more detail in International Publication No. WO 2005/060602, published on Jul. 7, 2005, hereby incorporated by reference, the system depicted in FIG. 1 consists of a vaporizer device capable of sublimating solids at a sufficient rate to provide a positive pressure across a conductance throttling device, and a vaporizer isolation valve to provide positive shut off of vapors from the vaporizer. A variable conductance is achieved using a commercial available servo-actuated vacuum butterfly valve controlled with a PD controller. Feedback control to the servo controller comes from a downstream heated pressure transducer. Other valves are shown that aid in vacuum pump down and venting for service.

Ion Source Detail

Figure 3:
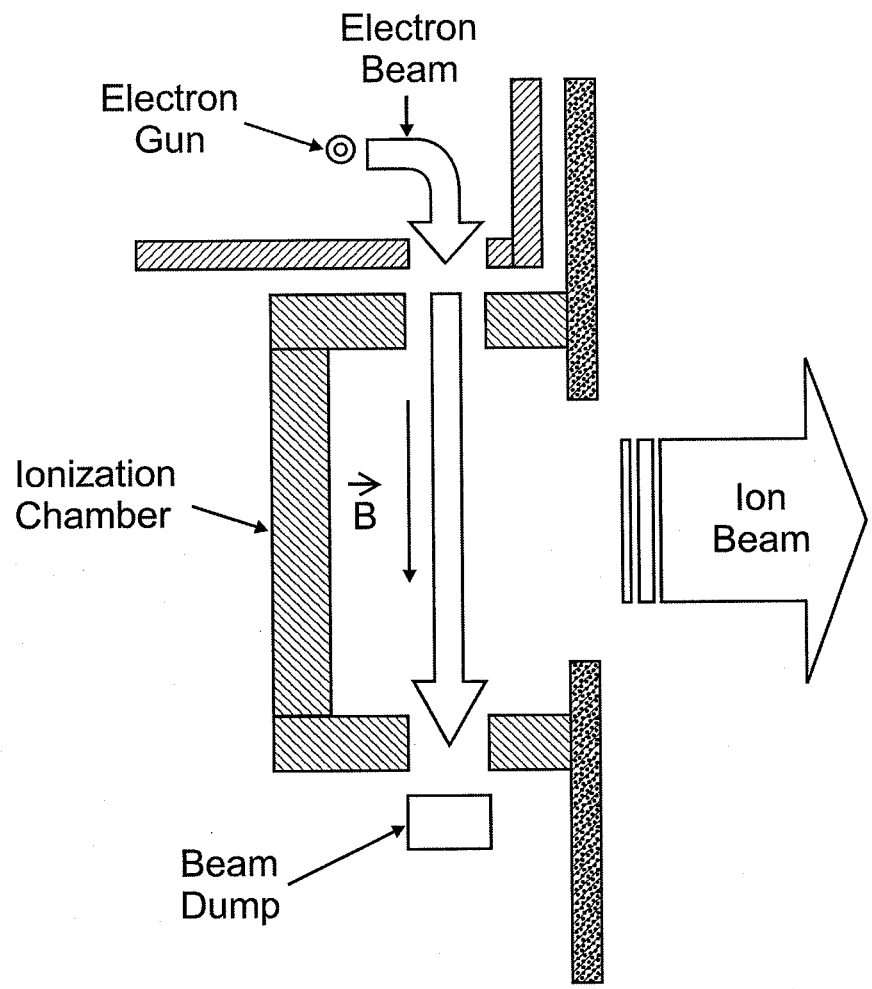
FIG. 3 is an exemplary soft ionization ion source in accordance with the present invention.

An exemplary ion source is shown in FIG. 1, and again in greater detail in FIG. 3. This exemplary ion source is described in detail in U.S. Pat. No. 7,023,138, hereby incorporated by reference, uses electron impact to provide the gentle ionization necessary to preserve the integrity of the molecules being ionized. The design of the source takes advantage of the remote electron emitter location made possible by the electron injection optics. By placing the emitter as shown in FIGS. 1 and 3, filament wear associated with ion erosion is minimized, helping to ensure long filament life. Alternative ion sources are also suitable for use with the present invention., such as disclosed in U.S. Pat. No. 7,022,999, hereby incorporated by reference.

The ion source of FIG. 3 is a soft ionization ion source which incorporates an external electron gun to generate an intense electron beam which is injected into the source ionization chamber. An externally generated electron beam creates a stream of ions just behind the long rectangular slot from which ions are extracted by the implanter optics.

The electron gun creates an energetic electron beam of between 1 mA and 100 mA, which, in the case of the exemplary ion source illustrated in FIG. 1, is then deflected through 90 degrees by a magnetic dipole field. Since the electron gun is remote from the ionization chamber and has no line-of sight to the process gas, it resides in the high vacuum environment of the implanter's source housing, resulting in a long emitter lifetime. The deflected electron beam enters the source ionization chamber though a small entrance aperture. Once within the ionization chamber, the electron beam is guided along a path parallel to and directly behind the ion extraction slot by a uniform axial magnetic field of about 100 Gauss produced by a permanent magnetic yoke surrounding the ionization chamber. Ions are thus created along the electron beam path and adjacent to the extraction slot. This serves to provide good extraction efficiency of the ions, such that an ion current density of up to 1 mA/cm² can be extracted from the source. The beam current dynamic range thus achieved is comparable to other sources; by varying emission current and also the flow of feed material into the source, a stable on-wafer electrical beam current of between 5 μA to and 2 mA is achieved.

The ion source system is designed with the requirements of low temperature vaporization in mind. The vapor delivery system is designed to provide the thermal management necessary to avoid condensation and deposition by methods which include the creation of a positive temperature gradient along the vapor delivery path. In addition to controlling the wetted surface temperatures in the delivery system, it is desirable to control the temperature of the source and the extraction electrode to minimize the condensation and deposition of vapor residues. Experience suggests that while it is important to keep surfaces which come into contact with the material warm enough to avoid material deposition by cooling from the vapor phase, it is also necessary to avoid high temperatures. Thus the ion source system depicted in FIG. 1 and FIG. 3 is temperature-controlled to a narrow temperature range, for example as discussed in detail in International Publication No. WO 2005/060602 A2, hereby incorporated by reference.

Ion Implantation System

FIG. 1(b) depicts the ion source system as a part of an entire ion implantation system. The ions produced by the ion source are extracted and accelerated by an extraction electrode and focused into an ion beam, which propagates into an analyzer magnet separate masses. The mass or range of masses desired for implantation into the semiconductor wafer is passed by a mass resolving aperture prior to the beam passing to the wafer. Some implanters have an additional beam line accelerator stage which adjusts the energy or velocity of the ion beam prior to implant. The wafer is held in a process chamber end station at high vacuum; robotics load and unload the wafer from the factory floor to the vacuum environment of the implanter.

FIG. 4 shows a dual-mode ion source. An exemplary dual mode ion source for use with the present invention is disclosed in US Patent Application Publication No. US 2006/0097645 A1, hereby incorporated by reference. This source has both an external electron gun and an indirectly-heated cathode which can produce high density plasma by an arc discharge; such a method is known in the art as a means to produce high monomer and multiply-charged ion currents of several tens of milliamperes. Molecular and cluster ions can also be generated by way of an arc discharge, for example, as disclosed in U.S. Pat. Nos. 6,288,403 and 6,958,481, hereby incorporated by reference. The dual mode source may be operated in either electron-impact mode or arc-discharge mode. The phosphorous and arsenic molecular ions in accordance with the present invent may be generated by way of direct electron impact or by way of a plasma, created, for example, by way of arc discharge.

Method of Making Transistors with Ions Produced from $P_7H_3$ and $As_7H_3$

Basic CMOS Transistor Structure

Figure 2:
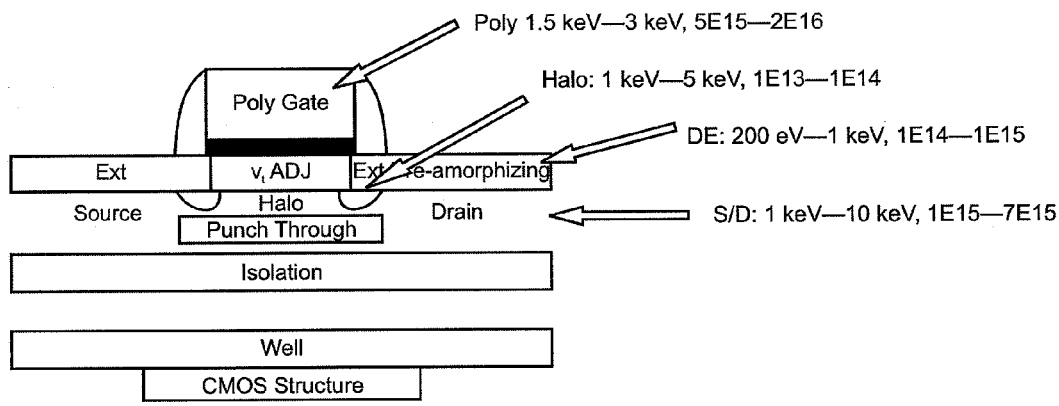
FIG. 2 represents a CMOS device structure showing relevant implants.

FIG. 2 shows the structure of a CMOS transistor. Indicated in FIG. 2 are implants which are appropriate for cluster implantation, both N- and P-type: Source/Drain (S/D), Drain Extension (DE), Halo (sometimes called Pocket Implant), and Poly Gate. These implants are considered highly doped, low-energy implants, and so are good candidates for the dose rate enhancement and low energy performance enabled by clusters.

Figure 12:
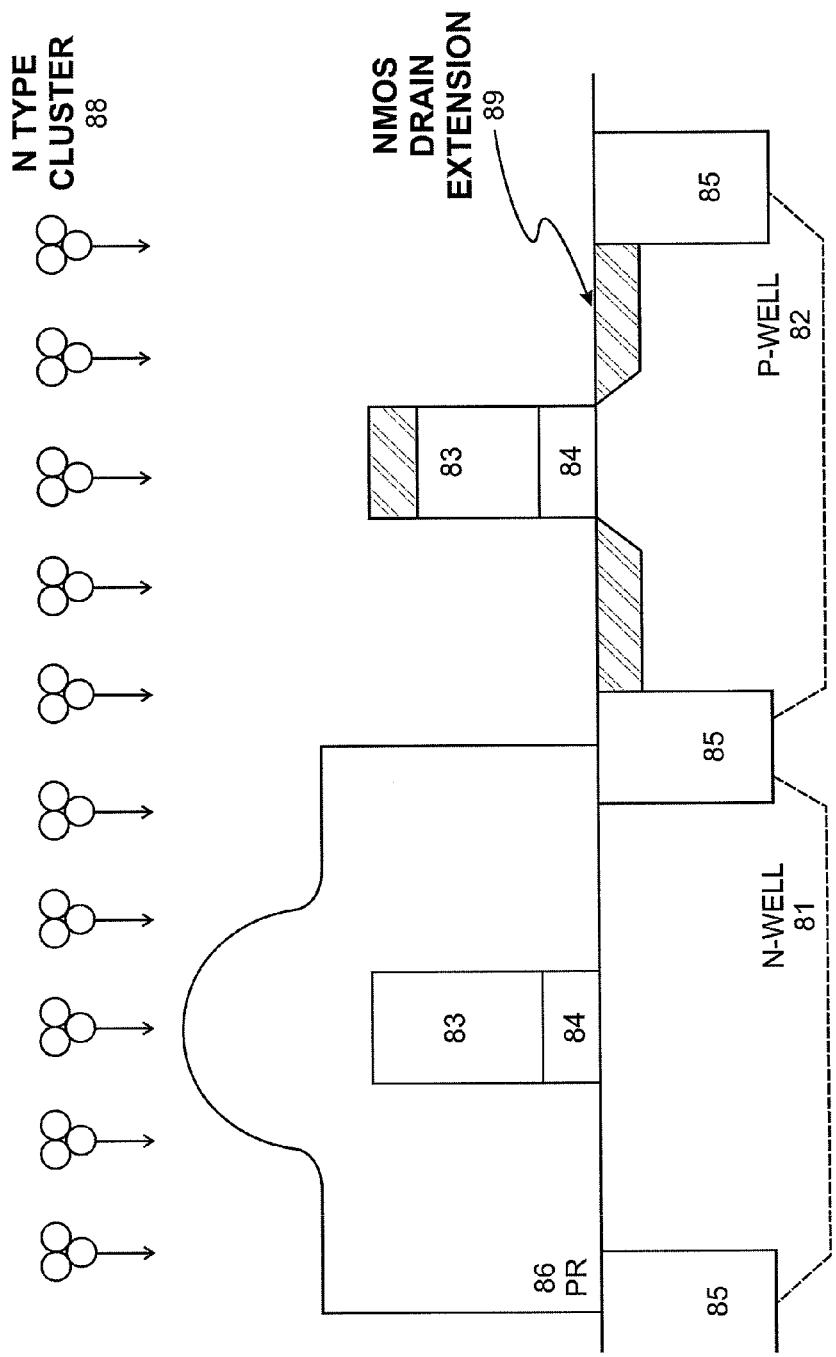
FIG. 12 is a diagram of a CMOS fabrication sequence during formation of the NMOS drain extension.

In a transistor, there are three voltage terminals: The source, gate, and drain. Electrical current (negative for electrons, positive for holes) flows from source to drain. The region below the gate is called the channel, and the region below the active portion of the transistor is the well; current therefore flows through the channel. This flow of current can be either on or off depending on the voltage applied to the gate. Thus, this is a two-state device. Depending on the sign of the carriers, the transistors are either NMOS (abundance of donor dopants in the well), or PMOS (abundance of acceptor dopants in the well). CMOS (Complementary MOS) uses an equal number of each type to simplify and increase the efficiency of the circuits in which the transistors are incorporated. Such a CMOS architecture is shown in FIG. 12. Boron is typically used for PMOS sources and drains; arsenic or phosphorus for NMOS sources and drains. The source and drain implants determine the effective field which drives current in the channel. They are conductive implants; that is, they are highly doped so that the average electrical conductivity is high. In short-channel devices, such as leading-edge logic and memory devices with gate lengths below 90 nm, this field is terminated by the drain extension implants, a very shallow, highly doped region which penetrates under the gate. This requires very low energy boron, arsenic and phosphorus implants. It is the drain extensions which determine the effective gate length of the transistors. It is important that the drain extension concentration profiles be as abrupt as possible in order to reduce device off-state leakage currents.

Amorphization for Channeling Control

To maintain abruptness and limit off-state leakage, Si or Ge pre-amorphization implants are usually conducted to eliminate channeling, which tends to create long tails in the as-implanted profiles. Unfortunately, end-of-range defects created by the implantation of Si or Ge can result in increased leakage elsewhere in the device. It is a significant benefit of cluster and molecular ion implantation that these pre-amorphization implants are not required, since the large molecular ions $B_{18}H_x^+$, $P_7H_x^+$, and $As_7H_x^+$ are expected to amorphize the silicon. Thus, the risk of leakage caused by end-or-range defects is avoided when molecular ions are used. As also indicated in FIG. 2, the table below outlines typical P+ and N+ implants which benefit from the use of cluster and molecular ion implants:

TABLE I

USJ implants which are good candidates for cluster and molecular ion implants

| Implant | Species | Dose Range | Energy Range |
|---|---|---|---|
| Drain Extension | B, P, As | 1E14-1E15 | 0.20-1 keV |
| Source/Drain | B, As | 1E15-7E15 | 1-10 keV |
| Halo | B, P | 1E13-1E14 | 1-5 keV |
| Poly Gate | B, P | 8E15-3E16 | 1-5 keV |

Halo Implants

The Halo implants are important for ameliorating so-called "short channel" effects, that is, they adjust the field within the channel to preserve a well-defined threshold voltage characteristic. In NMOS devices the Halo is P-type (e.g., boron), and in PMOS devices the Halo is N-type (e.g., phosphorus). The Halo is a high-angle implant introduced after Si or Ge pre-amorphization in the same lithography step used to dope the source/drain extension regions. Since the Halo implant uses high angle (e.g., 30 degrees) it should be done in four 90-degree rotations of the wafer in the implant tool to ensure both sides of the channel are doped and that transistors oriented in both X and Y directions.

The Halo implant, together with the well implant, sets the threshold voltage of the transistor. By reducing the initial well implant dose and introducing the Halo implant after gate patterning, a non-uniform channel doping profile is achieved. The Halo implant reduces threshold voltage roll-off in short channel devices. Also, higher drive current is achieved because the transistor has a more abrupt drain-channel junction and higher channel mobility than a non-halo device. Again, the use of molecular ions for these implants creates better abruptness by directly amorphizing the silicon substrate. There is also evidence that the dopant is better activated than without this amorphization, further increasing drive current and device performance.

Poly Gate Implant

Heavy doping of the polysilicon gate is particularly important in the dual-gate CMOS architecture used in memory devices (DRAM). Due to the high doping concentration, implant times are excessively long (and wafer throughput very low) using traditional monomer ions such as B and P. Typically, the gates are B-doped but in some processes the gate is also counter-doped with high concentrations of P. The use of molecular ions such as $B_{18}H_x^+$ and $P_7H_x^+$ can reduce implant times and restore production-worthy wafer throughput. Deceleration techniques cannot be used for these implants, resulting in very low throughput when conventional boron implants are used. This is because any high energy component of the ion beam will pass through the gate and be implanted in the channel, affecting the threshold voltage of the transistor. Thus, only drift-mode beams can be used. Since dose rate and throughput is high for cluster implants, it significantly enhances throughput for these implants—by a factor of 3 to 5 relative to using monomer boron implants.

Formation of N- and P-Type Shallow Junctions

Figure 13:
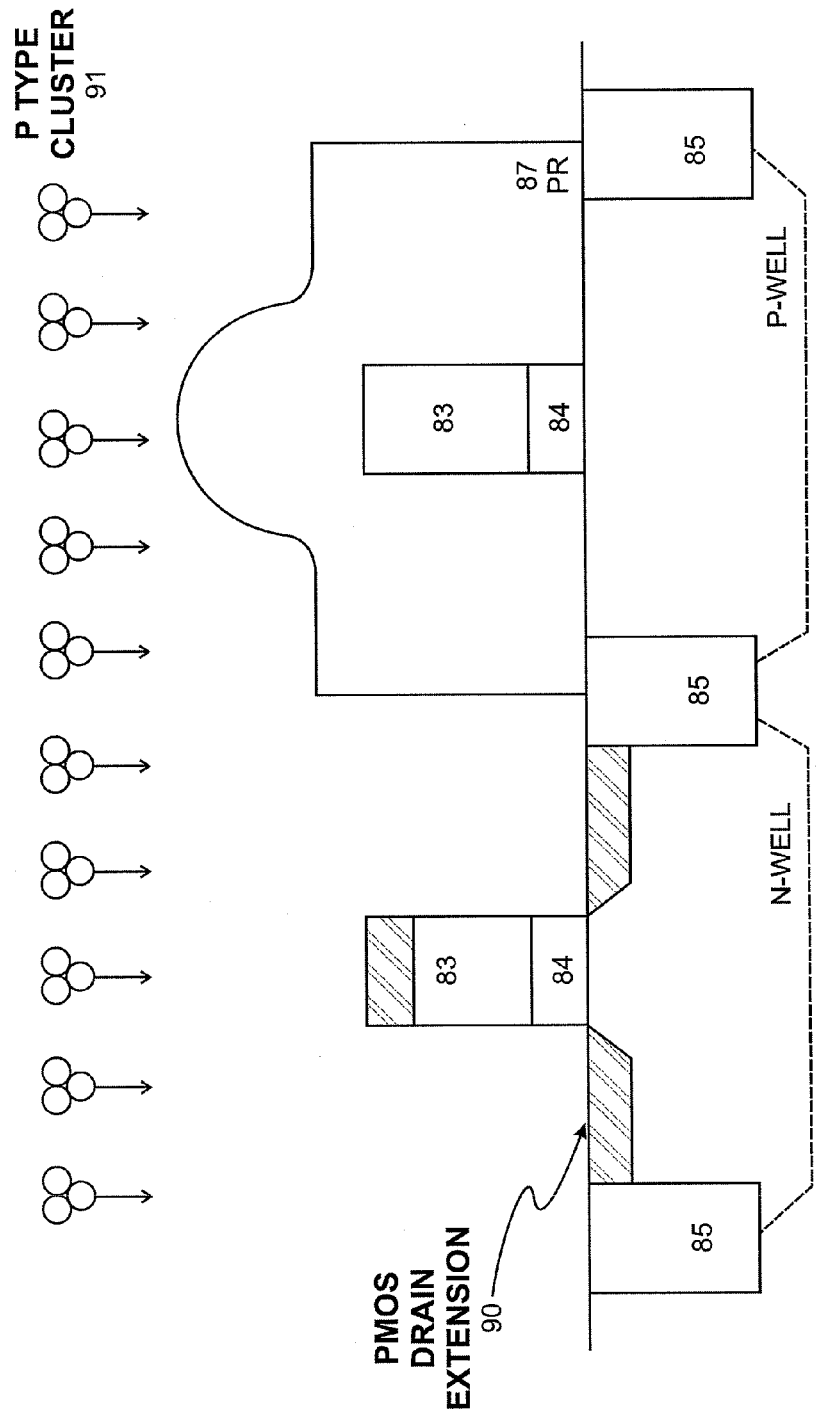
FIG. 13 is a diagram of a CMOS fabrication sequence during formation of the PMOS drain extension.

An important application of this method is the use of cluster ion implantation for the formation of N- and P-type shallow junctions as part of a CMOS fabrication sequence. CMOS is the dominant digital integrated circuit technology in current use and its name denotes the formation of both N-channel and P-channel MOS transistors (Complementary MOS: both N and P) on the same chip. The success of CMOS is that circuit designers can make use of the complementary nature of the opposite transistors to create a better circuit, specifically one that draws less active power than alternative technologies. It is noted that the N and P terminology is based on Negative and Positive (N-type semiconductor has negative majority carriers, and vice versa), and the N-channel and P-channel transistors are duplicates of each other with the type (polarity) of each region reversed. The fabrication of both types of transistors on the same substrate requires sequentially implanting an N-type impurity and then a P-type impurity, while protecting the other type of devices with a shielding layer of photoresist. It is noted that each transistor type requires regions of both polarities to operate correctly, but the implants which form the shallow junctions are of the same type as the transistor: N-type shallow implants into N-channel transistors and P-type shallow implants into P-channel transistors. An example of this process is shown in FIGS. 12 and 13. In particular, FIG. 12 illustrates a method for forming the N-channel drain extension 89 through an N-type cluster implant 88, while FIG. 13 shows the formation of the P-channel drain extension 90 by a P-type cluster implant 91. It is to be noted that both N- and P-types of transistors requires shallow junctions of similar geometries, and thus having both N-type and P-type cluster implants is advantageous for the formation of advanced CMOS structures.

Figure 14:
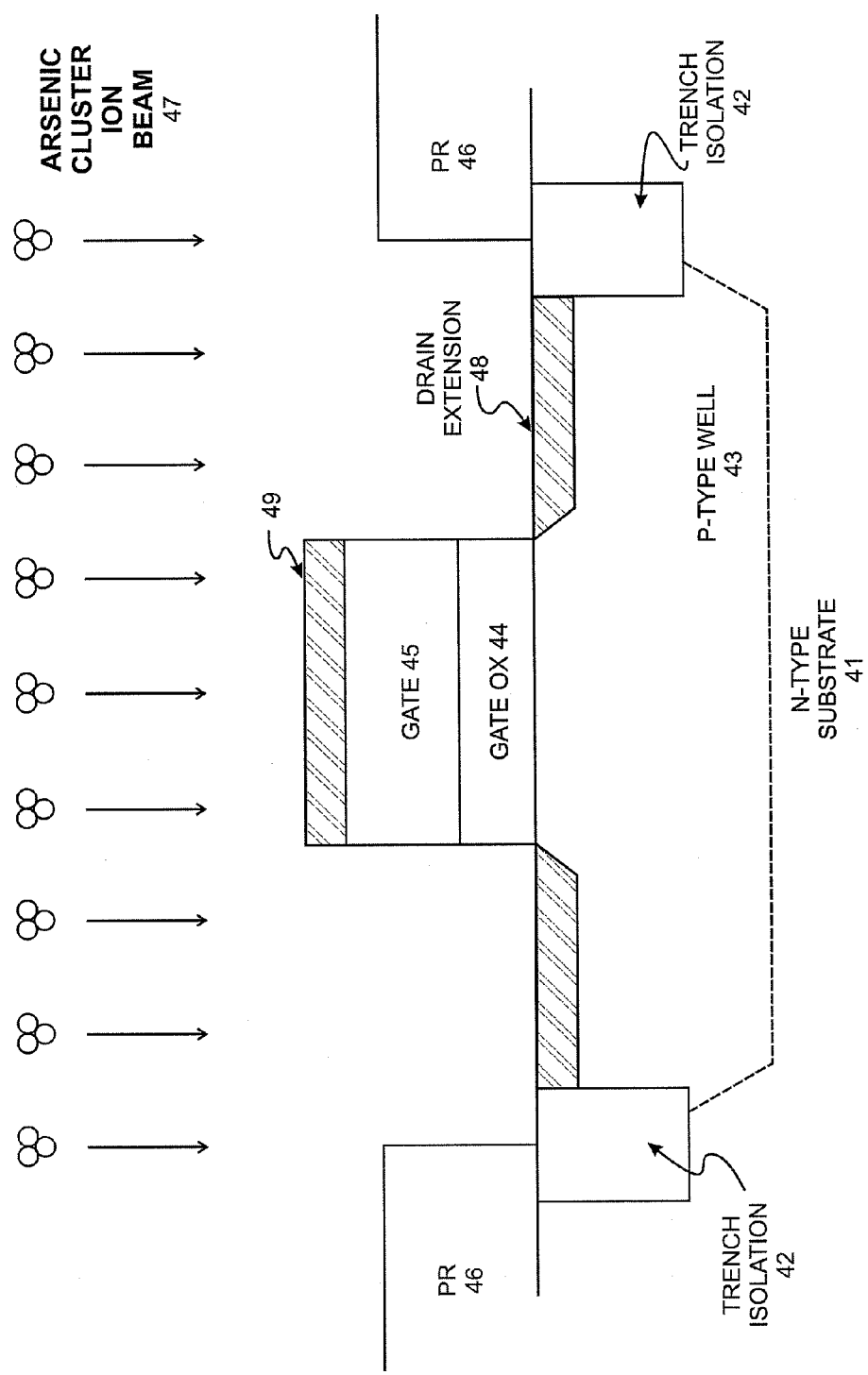
FIG. 14 is a diagram of a semiconductor substrate in the process of manufacturing a NMOS semiconductor device, at the step of N-type drain extension implant.

An example of the application of this method is shown in FIG. 14 for the case of forming an NMOS transistor. This figure shows semiconductor substrate 41 which has undergone some of the front-end process steps of manufacturing a semiconductor device. For example, the structure consists of a N-type semiconductor substrate 41 processed through the P-well 43, trench isolation 42, and gate stack formation 44, 45 steps, for example, as discussed in detail in International Publication No. WO 2004/003970 A2, published on Jan. 8, 2004, hereby incorporated by reference.

The P-well 43 forms a junction with the N-type substrate 41 that provides junction isolation for the transistors in the well 43. The trench isolation 42 provides lateral dielectric isolation between the N- and P-wells (i.e., in the overall CMOS structure). The gate stack is constructed, with a gate oxide layer 44 and a polysilicon gate electrode 45, patterned to form a transistor gate stack. A photoresist 46 is applied and patterned such that the area for NMOS transistors is exposed, but other areas of the substrate 41 are shielded. After the photoresist 46 is applied, the substrate 41 is ready for the drain extension implant, which is the shallowest doping layer required by the device fabrication process. A typical process requirement for leading-edge devices of the 0.09 μm technology node is an arsenic implant energy of between 1 keV and 2 keV, and an arsenic dose of $5 \times 10^{14}$ cm$^{-2}$. The cluster ion beam 47, for example As7Hx*, is directed at the semiconductor substrate, typically such that the direction of propagation of the ion beam is normal to the substrate, to avoid shadowing by the gate stack. The energy of the cluster $As_7H_x^+$, where x≥0 should be seven times the desired As$^+$ implant energy, e.g., between 7 keV and 14 keV. The clusters dissociate upon impact with the substrate, and the dopant atoms come to rest in a shallow layer near the surface of the semiconductor substrate, which forms the drain extension region 48. The same implant enters the surface layer of the gate electrode 49, providing additional doping for the gate electrode. The process described in FIG. 16 is thus one important application of the proposed invention.

Figure 15:
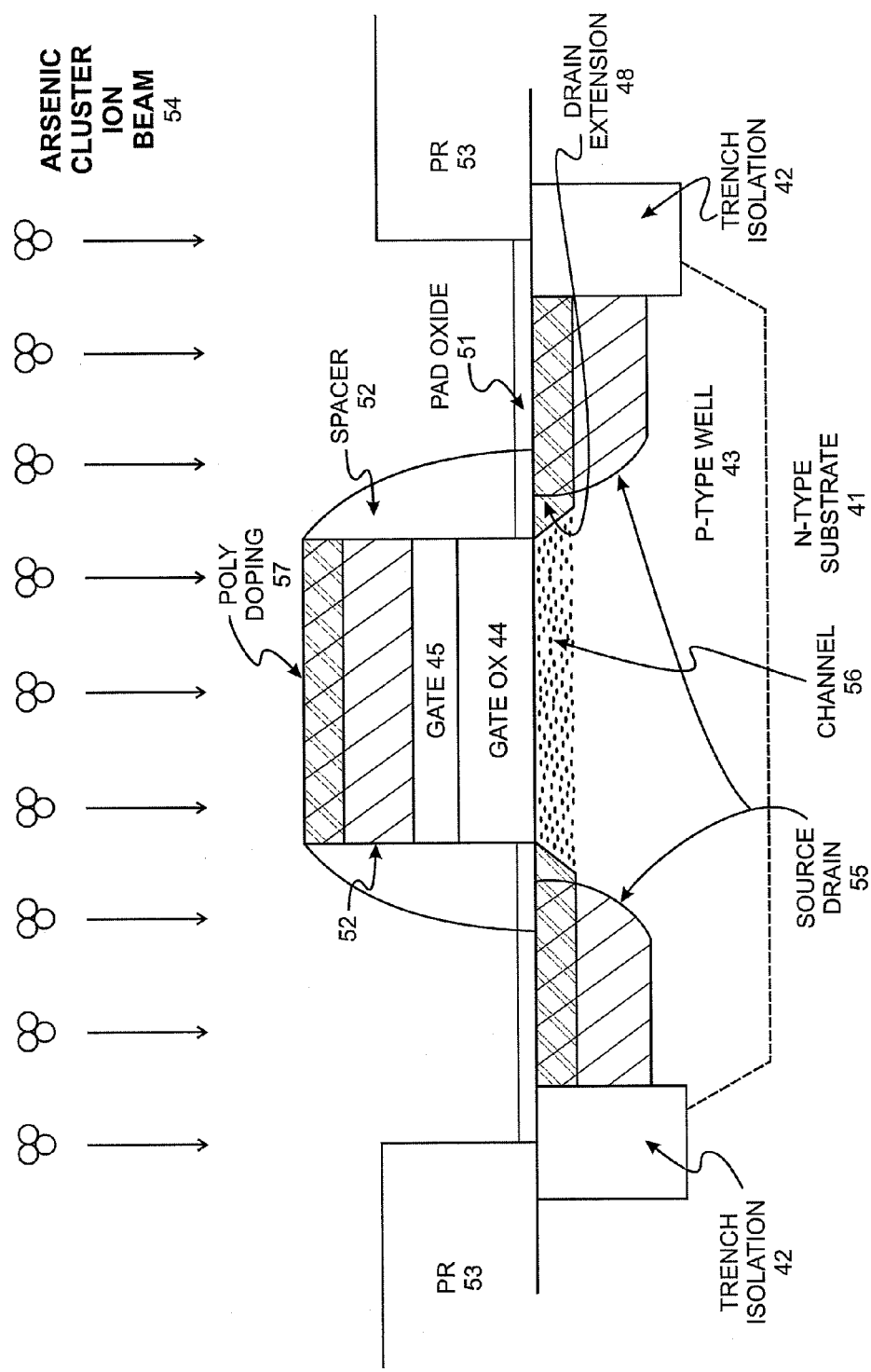
FIG. 15 is a diagram of a semiconductor substrate in the process of manufacturing a NMOS semiconductor device, at the step of the source/drain implant.

A further example of the application of this method is shown in FIG. 15: the formation of the deep source/drain regions. This figure shows the semiconductor substrate 41 of FIG. 14 after execution of further processes steps in the fabrication of a semiconductor device. The additional process steps include the formation of a pad oxide 51 and the formation of spacers 52 on the sidewalls of the gate stack. The pad oxide 51 is a thin layer of oxide (silicon dioxide) used to protect the exposed substrate areas, the top of the gate electrode 49 and the potentially exposed gate dielectric edge. The pad oxide 51 is typically thermally grown to a thickness of 5-10 nm. The spacer 52, on the other hand, is a region of dielectric, either silicon dioxide, silicon nitride, or a combination of these, which resides on the side of the gate stack and serves to insulate the gate electrode. It also serves as an alignment guide for the source/drain implant (e.g., 54), which must be spaced back from the gate edge for the transistor to operate properly. The spacers 52 are formed by the deposition of silicon dioxide and/or silicon nitride layers which are then plasma etched in a way to leave a residual layer on the side of the gate stack while clearing the dielectrics from the source/drain region.

After etching the spacers 52, a photoresist layer 53 is applied and patterned to expose the transistor to be implanted, an NMOS transistor in this example. Next, the ion implant to form the source and drain regions 55 is performed. Since this implant requires a high dose at low energy, it is an appropriate application of the proposed cluster implantation method. Typical implant parameters for the 0.13 μm technology node are approximately 6 keV per arsenic atom (54) at an arsenic dose of $5 \times 10^{15}$ cm$^{-2}$, so it requires a 42 keV, $7.14 \times 10^{14}$ cm$^{2}$ $As_7H_x^+$ implant. As shown in FIG. 15, the source and drain regions 55 are formed by this implant. These regions provide a high conductivity connection between the circuit interconnects (to be formed later in the process) and the intrinsic transistor defined by the drain extension 48 in conjunction with the channel region 56 and the gate stack 44, 45. We note that both S/D and Halo structures can be created using phosphorus implants rather than arsenic implants. In that case, $P_7H_x^+$ would be the ion of choice for the S/D extensions and poly gate dounter-doping implants. The gate electrode 45 can be exposed to this implant (as shown), and if so, the source/drain implant provides the primary doping source for the gate electrode. This is shown in FIG. 15 as the poly doping layer 57. In memory devices with a so-called dual poly gate structure, a P-type high dose implant is used; e.g., 2E16 at 3 keV boron energy. This can be accomplished with a 60 keV, 1.1E14 $B_{18}H_x^+$ implant, for example, as disclosed in US Patent Application Publication No. US 2006/0097193, published on May 11, 2006, hereby incorporated by reference.

Figure 16:
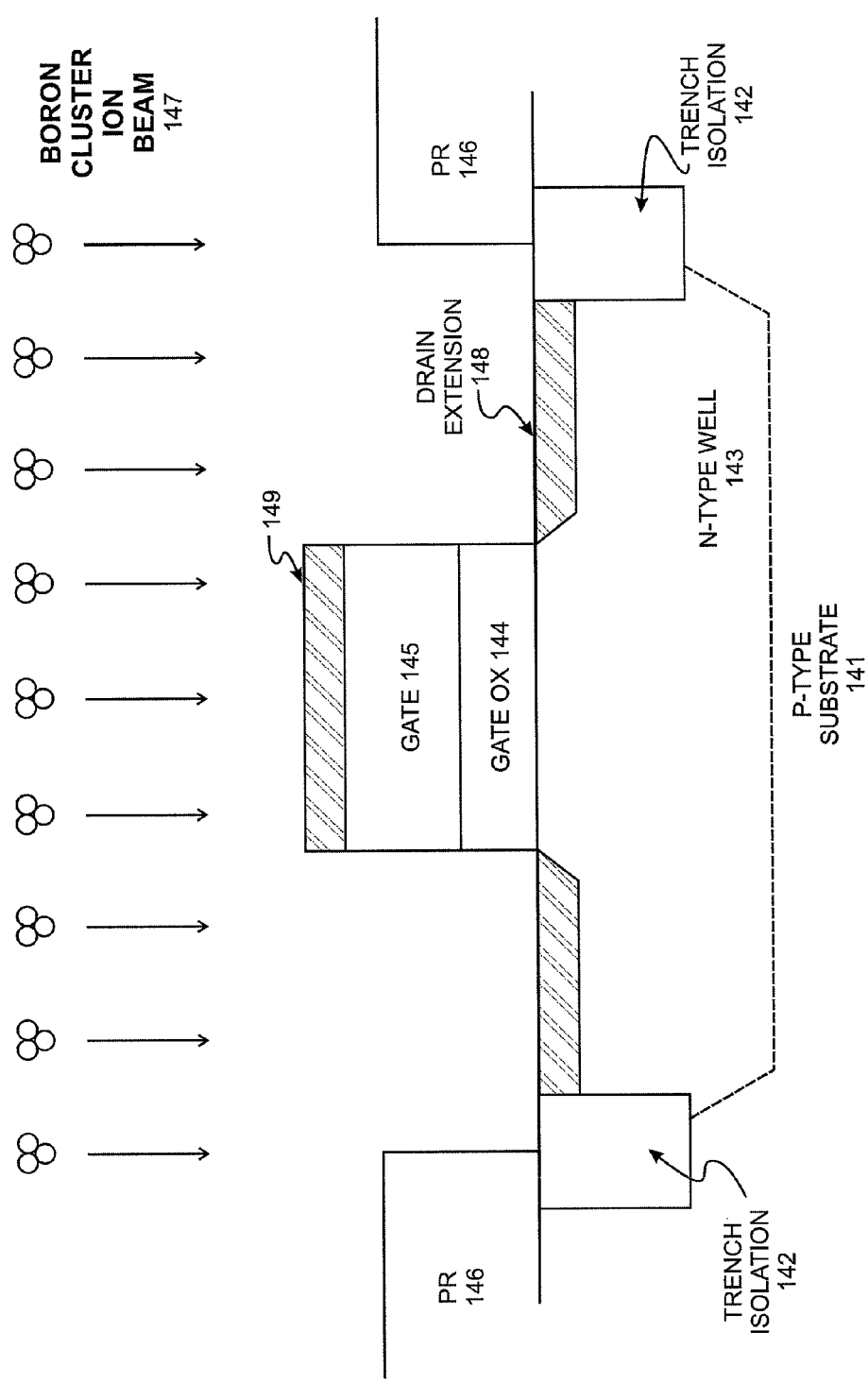
FIG. 16 is a diagram of a semiconductor substrate in the process of manufacturing an PMOS semiconductor device, at the step of P-type drain extension implant.
Figure 17:
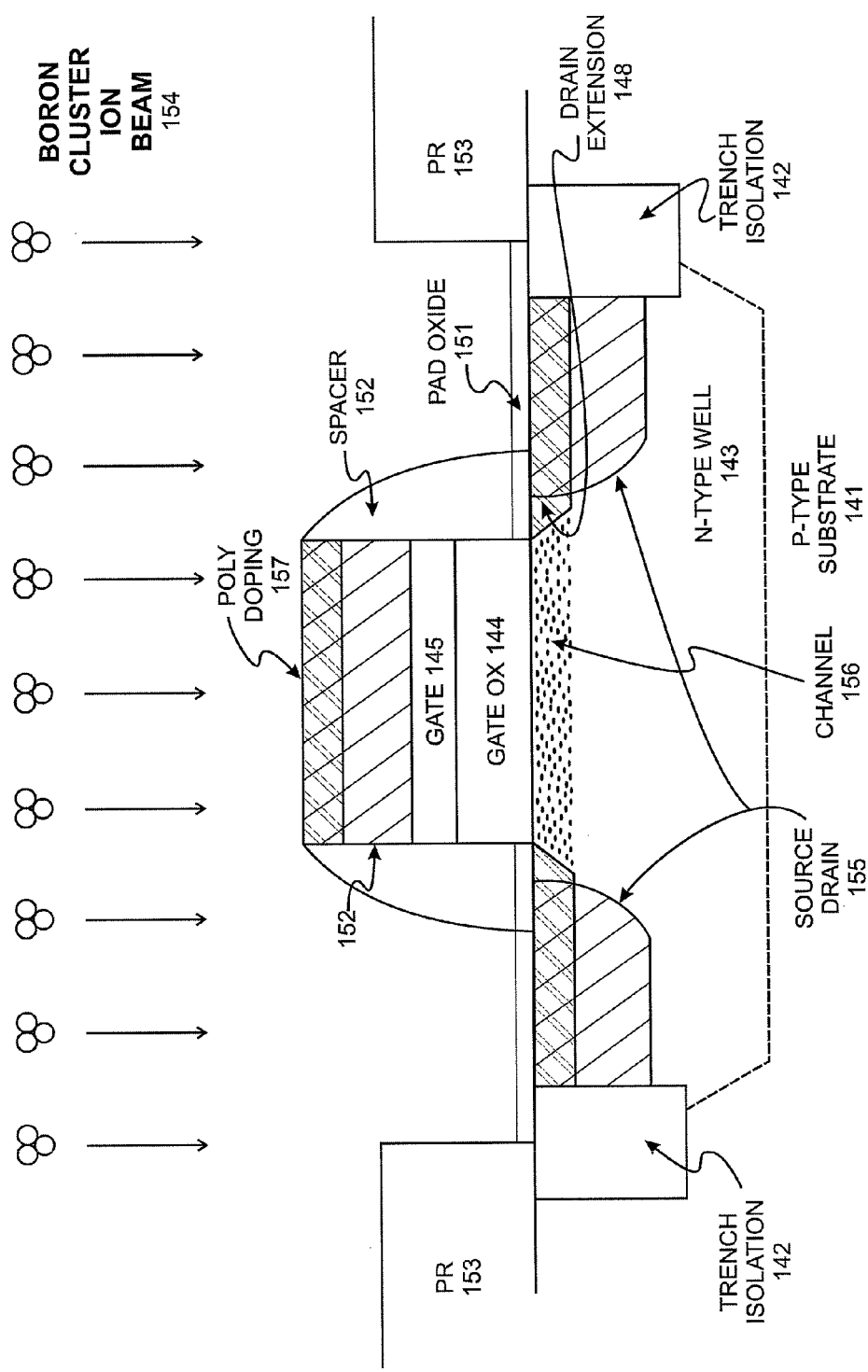
FIG. 17 is a diagram of a semiconductor substrate in the process of manufacturing a PMOS semiconductor device, at the step of the source/drain implant.

The detailed diagrams showing the formation of the PMOS drain extension 148 and PMOS source and drain regions 155 are shown in FIGS. 16 and 17, respectively. The structures and processes are the same as in FIGS. 15 and 16 with the dopant types reversed. In FIG. 16, the PMOS drain extension 148 is formed by the implantation of a boron cluster implant 147. Typical parameters for this implant would be an implant energy of 500 eV per boron atom with a dose of $5 \times 10^{14}$ cm$^{-2}$, for the 0.09 μm technology node. Thus, a $B_{18}H_x^+$ implant at 211 AMU would be at 9.6 keV at an octadecaborane dose of $2.8 \times 10^{13}$ cm$^{-2}$. FIG. 17 shows the formation of the PMOS source and drain regions 148, again by the implantation of a P-type cluster ion beam 154 such as octadecaborane. Typical parameters for this implant would be an energy of around 2 keV per boron atom with a boron dose of $5 \times 10^{15}$ cm$^{-2}$ (i.e., 38.4 keV octadecaborane at $2.8 \times 10^{14}$ cm$^{-2}$) for the 0.09 μm technology node.

In general, ion implantation alone is not sufficient for the formation of an effective semiconductor junction: a heat treatment is necessary to electrically activate the implanted dopants. After implantation, the semiconductor substrate's crystal structure is heavily damaged (substrate atoms are moved out of crystal lattice positions), and the implanted dopants are only weakly bound to the substrate atoms, so that the implanted layer has poor electrical properties. A heat treatment, or anneal, at high temperature (greater than 900 C) is typically performed to repair the semiconductor crystal structure, and to position the dopant atoms substitutionally, i.e., in the position of one of the substrate atoms in the crystal structure. This substitution allows the dopant to bond with the substrate atoms and become electrically active; that is, to change the conductivity of the semiconductor layer. This heat treatment works against the formation of shallow junctions, however, because diffusion of the implanted dopant occurs during the heat treatment. Boron diffusion during heat treatment, in fact, is the limiting factor in achieving USJ's in the sub-0.1 micron regime. Advanced processes have been developed for this heat treatment to minimize the diffusion of the shallow implanted dopants, such as the "spike anneal". The spike anneal is a rapid thermal process wherein the residence time at the highest temperature approaches zero: the temperature ramps up and down as fast as possible. In this way, the high temperatures necessary to activate the implanted dopant are reached while the diffusion of the implanted dopants is minimized. It is anticipated that such advanced heat treatments would be utilized in conjunction with the present invention to maximize its benefits in the fabrication of the completed semiconductor device.

Many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. A method of implanting ions comprising:
   (a) producing a volume of gas phase molecules of material of the form $A_nH_x$ or $A_nRH_x$, wherein n and x are integers, and 4<n, and x>0; "A" denotes phosphorus and "R" designating a molecule not containing phosphorus, and which is not injurious to the method of implanting ions;
   (b) ionizing the $A_nH_x$ or $A_nRH_x$ molecules to form $A_nH_y^+$, $A_nH_y^-$, $A_nRH_y^+$; or $A_nRH_y^-$, wherein y is an integer such that y>0, thereby forming ionized molecules; and
   (c) accelerating the ionized molecules by an electric field into a target.

2. The method as recited in claim 1, in which the volume of gas phase molecules of (a) comprises Heptaphosphane, $P_7H_3$.

3. The method as recited in claim 1, in which the volume of gas phase molecules of (a) comprises Cyclopentaphosphane, $P_5H_5$.

4. The method as recited in claim 1, in which the volume of gas phase molecules of (a) comprises Tetra-tertbutyl-hexaphosphane.

5. The method as recited in claim 1, in which the volume of gas phase molecules of (a) comprises Pentamethylheptaphosphane.

6. The method as recited in claim 1, wherein step (b) comprises:
   (b) ionizing the $A_nH_x$ or $A_nRH_x$ molecules by direct electron impact to form $A_nH_y^+$, $A_nH_y^-$, $A_nRH_y^+$; or $A_nRH_y^-$, wherein y is an integer such that y>0.

7. The method as recited in claim 1, wherein step (b) comprises:
   (b) ionizing the $A_nH_x$ or $A_nRH_x$ molecules by creating a plasma to form $A_nH_y^+$, $A_nH_y^-$, $A_nRH_y^+$; or $A_nRH_y^-$, wherein y is a an integer such that y>0.

8. The method as recited in claim 1, wherein step (b) comprises:
   (b) ionizing the $A_nH_x$ or $A_nRH_x$ molecules by way of an arc discharge to form $A_nH_y^+$, $A_nH_y^-$, $A_nRH_y^+$; or $A_nRH_y^-$, wherein y is an integer such that y>0.

9. A method of implanting ions comprising:
   (a) producing a volume of gas phase molecules of material having a form $A_nH_x$ or $A_nRH_x$, wherein n and x are integers, and 4<n, and x≥0; "A" denotes phosphorus, and "R" designating a molecule not containing phosphorus, and which is not injurious to the method of implanting ions;
   (b) forming a plasma containing $A_nH_x$ or $A_nRH_x$ molecules, $A_nH_y^+$, $A_nH_y^-$, $A_nRH_y^+$; or $A_nRH_y^-$ ions, wherein y is a an integer such that y>0, and electrons; and
   (c) accelerating a portion of said ions by an electric field to implant into a target, to perform doping of a semiconductor.

10. A method for forming a metal oxide semiconductor (MOS) device having a substrate, the method comprising:
    (a) forming a well and opposing trench isolations in a first region of said substrate;
    (b) forming a gate stack on said substrate between said opposing trench isolations defining exposed portions of said substrate; (a) and (b) defining a formation comprising:
       (i) depositing or growing a gate dielectric;
       (ii) depositing a polysilicon gate electrode, and
       (iii) patterning to form the gate stack;
    (c) depositing a pad oxide onto said exposed portions of said substrate and on top of said gate stack;
    (d) implanting $P_7H_x^+$ ions to form drain extensions between said gate stack and said opposing trench isolations;
    (e) forming spacers adjacent said gate stack;
    (f) implanting N-type cluster ions to form source and drain regions;
    (g) providing heat treatment to activate material implanted by step (d), thereby forming an N-type metal oxide semiconductor (MOS) device (NMOS).

11. The method as recited in claim 10, further including:
    (a) isolating first and second regions on said substrate;
    (b) forming said NMOS device in a first region; and
    (c) forming a PMOS device in a second region.

12. The method as recited in claim 11 wherein step (c) includes implanting P-type cluster ions in said second region.

13. The method as recited in claim 12, wherein said P-type cluster ions are $B_{18}H_x^+$ or $B_{18}H_x^-$, where 0≤x≤6.

14. A method of implanting ions comprising:
    (a) producing a volume of gas phase molecules which includes $P_7H_3$;
    (b) ionizing said volume of gas phase molecules creating a plurality of ions having different masses;
    (c) selecting one of said plurality of ions by mass defining a selected ion; and
    (d) implanting said selected ion into a target.

15. The method as recited in claim 14, wherein steps (c) and (d) comprise:
    (c) selecting $P_7H_3^+$ ions; and
    (d) implanting said $P_7H_3^+$ ions into the target.

16. The method as recited in claim 14, wherein steps (c) and (d) comprise:
    (c) selecting $P_7H_3^-$ ions; and
    (d) implanting said $P_7H_3^-$ ions into the target.

17. A method for forming a semiconductor device comprising:
    (a) generating molecular donor ions of the form $A_nH_y^+$, $A_nH_y^-$, $A_nRH_y^+$, or $A_nRH_y^-$, wherein n and y are integers, and 4<n, and y>0; "A" denotes phosphorus, and "R" designating a molecule not containing phosphorus, and which is not injurious to the method;
    (b) implanting said molecular donor ions into a target forming an N-type region in said target;
    (c) generating P-type ions;
    (d) implanting said P-type ions in said target adjacent said N-type region forming a P-type region.

18. The method as recited in claim 17, wherein step (c) and (d) comprise:

(c) generating molecular P-type ions; and
(d) implanting said P-type molecular ions in said target adjacent said N-type region to form the P-type region.

19. The method as recited in claim 17, wherein step (c) and (d) comprise:
(c) generating P-type cluster ions; and
(d) implanting said P-type cluster ions in said target adjacent said N-type region to form the P-type region.

20. The method as recited in claim 19, wherein step (c) and (d) comprise:
(c) generating $B_{18}H_x^+$ ions; and
(d) implanting said $B_{18}H_x^+$ ions in said target adjacent said N-type region forming a P-type region.

21. A method of implanting ions comprising:
(a) producing a volume of gas phase molecules of material having a form $A_nH_x$ or $A_nRH_x$, wherein n and x are integers, and, 4<n, and x≥0; "A" denotes arsenic, and "R" designating a molecule not containing arsenic, and which is not injurious to the method;
(b) ionizing the $A_nH_x$ or $A_nRH_x$ molecules to form $A_nH_y^+$, $A_nH_y^-$, $A_nRH_y^+$; or $A_nRH_y^-$, wherein y is an integer such that y>0, thereby forming ionized molecules; and
(c) accelerating the ionized molecules by an electric field into a target.

22. The method as recited in claim 21, in which the volume of gas molecules of (a) comprise $As_7H_3$.

23. The method as recited in claim 21, in which the volume of gas molecules of (a) comprises $As_5H_5$.

24. A method of implanting ions comprising:
(d) producing a volume of gas phase molecules of material having a form $A_nH_x$, or $A_nRH_x$, wherein n and x are integers, and 4<n and x≥0; "A" denotes—arsenic, and "R" designating a molecule not containing arsenic, and which is not injurious to the method;
(e) forming a plasma containing $A_nH_x$ or $A_nRH_x$ molecules, $A_nH_y^+$, $A_nH_y^-$, $A_nRH_y^+$, or $A_nRH_y^-$ ions, wherein y is an integer such that y>0, and electrons; and
(f) accelerating a portion of said ions by an electric field to implant into a target, to perform doping of a semiconductor.

25. A method for forming a metal oxide semiconductor (MOS) device having a substrate, the method comprising:
(g) forming a well and opposing trench isolations in a first region of said substrate;
(h) forming a gate stack on said substrate between said opposing trench isolations defining exposed portions of said substrate; said formation comprising:
(i) depositing or growing a gate dielectric;
(ii) depositing a polysilicon gate electrode, and
(iii) patterning to form the gate stack;
(i) depositing a pad oxide onto said exposed portions of said substrate and on top of said gate stack;
(j) implanting $As_7H_x^+$ ions to form drain extensions between said gate stack and said opposing trench isolations;
(k) forming spacers adjacent said gate stack;
(l) implanting N-type cluster ions to form source and drain regions;
(m) providing heat treatment to activate material implanted by step (d), thereby forming an N-type metal oxide semiconductor (MOS) device (NMOS).

26. The method as recited in claim 25, further including the steps of:
(a) isolating first and second regions on said substrate;
(b) forming said NMOS device in a first region; and
(c) forming a PMOS device in a second region.

27. The method as recited in claim 26 wherein step (c) includes implanting P-type cluster ions in said second region.

28. The method as recited in claim 27, wherein said P-type cluster ions are $B_{18}H_x^+$ or $B_{18}H_x^{31}$, where 0≤x≤6.

29. A method for forming a semiconductor device comprising:
(a) generating molecular donor ions having a form $A_nH_y^+$, $A_nH_y^-$, $A_nRH_y^+$, or $A_nRH_y^-$,, wherein n and y are integers, and, 4<n, and x≥0; "A" denotes arsenic, and "R" designating a molecule not containing arsenic, and which is not injurious to the method;
(b) implanting said molecular donor ions into a target forming an N-type region in said target;
(c) generating P-type ions;
(d) implanting said P-type ions in said target adjacent said N-type region forming a P-type region.

30. The method as recited in claim 29, wherein step (c) and (d) comprise:
(c) generating molecular P-type ions; and
(d) implanting said P-type molecular ions in said target adjacent said N-type region forming a P-type region.

31. The method as recited in claim 29, wherein step (c) and (d) comprise:
(c) generating P-type cluster ions; and
(d) implanting said P-type cluster ions in said target adjacent said N-type region to form the P-type region.

32. The method as recited in claim 31, wherein step (c) and (d) comprise:
(c) generating $B_{18}H_x^+$ ions; and
(d) implanting said $B_{18}H_x^+$ ions in said target adjacent said N-type region to form the P-type region.

33. The method as recited in claim 29, wherein step (b) comprises:
(b) ionizing the $A_nH_x$ or $A_nRH_x$ molecules by direct etectron impact to form $A_nH_y^+$, $A_nH_y^-$, $A_nRH_y^+$, or $A_nRH_y^-$, wherein y is an integer such that y>0.

34. The method as recited in claim 29, wherein step (b) comprises:
(b) ionizing the $A_nH_x$ or $A_nRH_x$ molecules by creating a plasma to form $A_nH_y^+$, $A_nH_y^-$, $A_nRH_y^+$, or $A_nRH_y^-$, wherein y is an integer such that y>0.

35. The method as recited in claims 29, wherein step (b) comprises:
(b) ionizing the $A_nH_x$ or $A_nRH_x$ molecules by way of an arc discharge to form $A_nH_y^+$, $A_nH_y^-$, $A_nRH_y^+$, or $A_nRH_y^-$, wherein y is an integer such that y>0.

* * * * *